(12) United States Patent
Ohnishi et al.

(10) Patent No.: US 7,825,731 B2
(45) Date of Patent: Nov. 2, 2010

(54) RF AMPLIFYING DEVICE

(75) Inventors: Masami Ohnishi, Hachioji (JP); Ryouichi Tanaka, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/192,240

(22) Filed: Aug. 15, 2008

(65) Prior Publication Data

US 2009/0085666 A1  Apr. 2, 2009

(30) Foreign Application Priority Data

Sep. 28, 2007  (JP)  ............................. 2007-253391

(51) Int. Cl.
*H03F 3/213* (2006.01)
(52) U.S. Cl. ..................... 330/286; 330/192; 330/295; 330/126
(58) Field of Classification Search ................. 330/126, 330/51, 307, 286, 295, 124 R
See application file for complete search history.

(56) References Cited

U.S. PATENT DOCUMENTS 3,919,656 A * 11/1975 Sokal et al. .................... 330/51
6,223,022 B1 * 4/2001 Birth et al. ..................... 455/80

OTHER PUBLICATIONS

Inder Bahl, "Broadband and Compact Impedance Transformers for Microwave Circuits", IEEE Microwave Magazine, Aug. 2006, pp. 56, 58-60, and 62.

J. Horn et al., "Integrated Transmission Line Transformer", IEEE MTT-S Digest , 2004, pp. 201-204.

Bill Toole et al., "A Low Voltage, Low Power RF CMOS LNA for Bluetooth Applications Using Transmission Line Transformers", Proceedings of the 27$^{th}$ European Solid-State Circuits Conference, ESSCIRC, Sep. 2001, pp. 433-436.

Octavius Pitzalis et al., "Broadband 60-W HF Linear Amplifier", IEE Journal of Solid-State Circuits, vol. SC-6, No. 3, Jun. 1971, pp. 93-103.

Brett Klehn et al., "An Exact Analysis of Class-E Power Amplifiers for RF Communications", Proceedings of the 2004 International Symposium on Circuits and Systems, pp. 277-280.

* cited by examiner

*Primary Examiner*—Robert Pascal
*Assistant Examiner*—Hieu P Nguyen
(74) *Attorney, Agent, or Firm*—Miles & Stockbridge P.C.

(57) ABSTRACT

An RF amplifying device includes a transmission line transformer coupled to an output electrode of a power transistor for generating transmission power to be fed to an antenna. The transmission power from the output electrode of the power transistor is fed to one end of a main line of the transmission line transformer, and one end of a secondary line of the transmission line transformer is coupled to an AC grounding node. The other end of the secondary line is coupled to the one end of the main line, thereby generating the transmission power. Coupling energy is transmitted from the secondary line to the main line. Coupling members electrically coupled to the output electrode of the power transistor are electrically coupled to a joint formed in either the main line, or the secondary line, at part of the energy coupling part.

20 Claims, 9 Drawing Sheets

RF AMPLIFYING DEVICE

CLAIM OF PRIORITY

The present application claims priority from Japanese patent application JP 2007-253391 filed on Sep. 28, 2007, the content of which is hereby incorporated by reference into this application.

FIELD OF THE INVENTION

The invention relates to an RF (radio frequency) amplifying device having a transmission line type matching circuit, and in particular, to a technology useful in maintaining a condition for impedance matching upon coupling an output electrode of a power transistor in the final amplifying stage with a transmission line transformer serving as an impedance matching circuit.

BACKGROUND OF THE INVENTION

A plurality of communication systems are included in mobile communications as represented by a cellular telephone. For example, in Europe, there exists W-CDMA as a third generation communication system that has recently started its service in addition to GSM prevalent as a second generation communication system, and EDGE at a transmission rate enhanced from that of GSM data communications. Further, in North America, cdma 1x as a third generation communication system is prevalent in addition to DCS, and PCS, as a second generation communication system. Incidentally, GSM stands for Global System for Mobile Communications. EDGE stands for Enhanced Data rate for GSM Evolution. W-CDMA stands for Wide-band Code Division Multiple Access. DCS stands for Digital Cellular System. PCS stands for Personal Communications System, and cdma 1x stands for Code Division Multiple Access 1x.

In Non-patent document 1 described hereunder, it is described that a matching technology with the use of a transmission line transformer (TLT: Transmission Line Transformer) is used in multi-octave impedance conversion by an RF wave, and a low-end microwave. With a conventional power amplifier, a multitude of inductors, capacitors, and transmission lines, or combinations thereof are generally used in a ladder circuit in order to implement a transformer for converting an ultra-low impedance to 50 Ω in a band of an octave, or more. In the case of a traditional technology using those constituents, the power amplifier has a limited frequency band, and is lager in circuit size. A transmission line transformer (TLT) using a straight line section, or a coil section of the transmission line as coupled will have a broadband, and be smaller in circuit size. Further, in the Non-patent document 1 described hereunder, it is also described that this type of the transformer can be designed to enable application of a multi-level interconnection manufacturing technology to any of, for example, a printed wiring board, low temperature calcined ceramics (LTCC), high temperature calcined ceramics (HTCC), a monolithic silicon (Si) IC, and a gallium arsenide (GaAs) IC.

In Non-patent document 2 described hereunder, a Guanella type transmission line transformer (TLT), and a Ruthroff type transmission line transformer (TLT) are introduced, and it is further described that a non-equilibrium Guanella type transmission line transformer (TLT) is formed by use of three-layer interconnections provided on a GaAs substrate.

In Non-patent document 3 described hereunder, it is described that in contrast to a conventional transformer functioning by coupling of magnetic fluxes, a transmission line transformer (TLT) differs from the former in that energy is transmitted to an output circuit in a transmission line mode. In general, floating inductance and parasitic capacitance are absorbed by a characteristic impedance of a transmission line, so that the transmission line transformer (TLT) is considered to end up indicating a broader frequency band, and higher efficiency than in the case of the conventional transformer. An off-chip transmission line transformer (TLT) is in use for conversion of a single-end signal to a differential signal by use of a low noise amplifier (LNA) for application of 2.4 GHz Bluetooth, or reverse conversion thereof.

In Non-patent document 4 described hereunder, it is described that while internal interconnection capacitance must be taken into consideration in a frequency band of 2 to 30 MHz although a transformer is a useful constituent for impedance matching, the Guanella type transmission line transformer (TLT), and the Ruthroff type transmission line transformer (TLT) are useful at a phenomenally large power level, and can be configured with ease, being inexpensive, and light in weight, thereby enabling a broader band to be used. With a broadband high-output RF linear amplifier in the frequency band of 2 to 30 MHz, for use in SSB and AM communications, a transmission line transformer (TLT) wound around a ferrite toroid is used between stages of a multistage amplifier, and in an output matching circuit.

Further, in Non-patent document 5 described hereunder, there is described use of choke inductance as a load of a power amplifier for RF communications, of which high efficiency is required. In the Non-patent document 5, it is also described that the choke inductance can check harmonics of current fed from a DC power supply to the amplifier.

[Non-Patent Document 1]
Inder J. Bahl, "Broadband and Compact Impedance Transformer for Microwave Circuits", IEEE MCROWAVE magazine, pp. 56-62, August, 2006.

[Non-Patent Document 2]
J. Horn, et al., "Integrated Transmission Line Transformer", 2004 IEEE MTT-S Digest, pp. 201-204

[Non-Patent Document 3]
Bill Toole, et al., "A Low Voltage, Low Power RF CMOS LNA for Bluetooth Applications using Transmission Line Transformers", Proceedings of the 27th European Solid—State Circuits Conference, 2001, ESSCIRC, 18-20 Sep. 2001, pp. 433-436

[Non-Patent Document 4]
OCTAVIUS PITZALIS, et al., "Broadband 60—W HF Linear Amplifier" IEEE JOURNAL OF SOLID-STATE CIRCUITS, VOL. SC-6, NO. 3, June 1971, pp. 93-103

[Non-Patent Document 5]
Brett E. Klehn, et al., "AN EXACT ANALYSIS OF CLASS—E POWER AMPLIFIERS FOR RF COMMUNIATIONS", Proceedings of the 2004 International Symposium on Circuits and Systems, pp. 277-280

SUMMARY OF THE INVENTION

As described in the non-patent document 5 as above, the choke inductor is used as the load of the RF power amplifier. The inventor, et al. were engaged in the development of an RF power module with an RF power amplifier incorporated therein prior to the development of the invention. It is possible to reduce a power supply voltage by half with the use of an RF choke as compared with the case of using resistance as the load of the RF power amplifier. However, a large current-carrying capacity and a high Q factor are required of the RF choke inductor. In order to attain the large current-carrying capacity and the high Q factor, however, a problem is encountered in that an occupied area of a spiral coil, over a semiconductor chip or a multi-level interconnection substrate, is large in size.

Further, as is well known, for supplying transmission power at a low power supply voltage to a 50-Ω antenna of mobile communications equipment such as a cellular telephone, and so forth, an impedance matching circuit is coupled between an output of the RF power amplifier, and the antenna as the load thereof. By use of, for example, a lossless transformer having a transformation ratio of 1:4 as the impedance matching circuit, a peak-to-peak amplitude at 5 V of the RF power amplifier will be turned to a peak-to-peak amplitude at 20 V. In other words, with the use of the transformer as the impedance matching circuit, load impedance can be effectively converted lower in value, so that it is possible to output a target transmission power even at a limited amplitude outputted by the RF power amplifier.

As described in the non-patent document 1 as above, it is possible to implement a broadband, and smaller circuit size by use of the transmission line transformer (TLT) as compared with the case of the conventional technology using the transformer.

FIG. 1 is a schematic view showing an RF power amplifier incorporated in an RF power module under review by the inventor, et al. prior to the development of the invention.

With the RF power amplifier shown in FIG. 1, a transmission line transformer (TLT) serving as a impedance matching circuit is coupled between a collector output electrode of a power hetrojunction bipolar transistor (HBT) Q in the final amplification stage of the RF power amplifier, and an output terminal Pout of the RF power module. Further, transmission power to be fed to a 50-Ω antenna (not shown) of a cellular telephone is outputted from the output terminal Pout of the RF power module.

As shown in FIG. 1, the transmission line transformer TLT comprising a main line Lout and a secondary line Lin can be formed of multilevel interconnections formed over the main surface of a circuit board CB of the RF power module, made of a multilevel interconnection substrate, and so forth. For example, the secondary line Lin of the transmission line transformer TLT is formed of a lower-level interconnection of the multilevel interconnections while the main line Lout of the transmission line transformer TLT is formed of an upper-level interconnection of the multilevel interconnections, and a configuration reverse to the above may be adopted. An interlayer dielectric (not shown) is disposed between the secondary line Lin formed of the lower-level interconnection of the multilevel interconnections, and the main line Lout formed of the upper-level interconnection of the multilevel interconnections. An operating voltage Vcc can be fed to one end Lin (B) of the secondary line Lin formed of the lower layer interconnection of the multilevel interconnections, and an input signal from a collector output electrode CBP of the power hetrojunction bipolar transistor (HBT) Q can be fed to the other end Lin (A) of the secondary line Lin. More specifically, the other end Lin (A) of the secondary line Lin is coupled to one end In (A) of the main line Lout of the transmission line transformer (TLT) via a through-connection interconnection Th formed in the interlayer dielectric. An RF collector output signal of the power hetrojunction bipolar transistor (HBT) Q is fed to the one end In (A) of the main line Lout of the transmission line transformer TLT.

Accordingly, due to impedance conversion from the secondary line Lin of the transmission line transformer TLT to the main line Lout, conversion output power of the power hetrojunction bipolar transistor (HBT) Q can be generated from the other end Out (A) of the main line Lout of the transmission line transformer TLT. That is, a characteristic impedance is developed by the agency of the interlayer dielectric disposed between the secondary line Lin of the transmission line transformer TLT and the main line Lout. Accordingly, an inductive-capacitive coupling energy is transmitted in a transmission line mode from the secondary line Lin of the transmission line transformer TLT to the main line Lout. Therefore, it becomes possible to take out an RF amplified voltage signal from an output electrode of an amplifier element without the use of an air-core coil as a load circuit, and without the use of a spiral coil, or choke inductance, having a large current-carrying capacity and a high Q factor.

The power hetrojunction bipolar transistor (HBT) Q is formed over an III-V group compound semiconductor chip, and for the power hetrojunction bipolar transistor (HBT) Q, use is made of a hetrojunction bipolar transistor of, for example, GaAs, and InP. Further, as another HBT, use can be made of an SiGe hetrojunction bipolar transistor formed over a silicon substrate, as well. Accordingly, the collector output electrode of the power hetrojunction bipolar transistor (HBT) Q is formed of an interconnection layer CBP fabricated on the surface of the III-V group compound semiconductor chip, or on the surface of a silicon semiconductor chip by a semiconductor manufacturing process. The collector output electrode CBP of the power hetrojunction bipolar transistor (HBT) Q is coupled to a joint CP of the main line Lout as the upper-level interconnection formed over the main surface of the circuit board CB of the RF power module via four bonding wires BW coupled in parallel. Low parasitic resistance and low parasitic inductance, caused by the four bonding wires BW coupled in parallel, will reduce a voltage drop owing to a collector current of the power hetrojunction bipolar transistor (HBT) Q on the order of an ampere. In this connection, the joint CP of the main line Lout as the upper-level interconnection is a bonding pad for the four bonding wires BW.

That is, the joint CP of the bonding pad is formed so as to be isolated from an energy transmission/coupling part for inductive-capacitive coupling, located between the transmission line of the main line Lout, and the transmission line of the secondary line Lin of the transmission line transformer TLT. A first reason as the main reason for isolation described as above is to lessen effects of magnetic fluxes of an RF frequency generated from the four bonding wires BW coupled to the joint CP of the bonding pad on the energy transmission coupling part between the transmission line of the main line Lout, and the transmission line of the secondary line Lin, of the transmission line transformer TLT. A second reason for the isolation is to lesson effects of mechanical pressure exerted by a wire bonder in the step of wire bonding with the bonding wires BW at the time of manufacturing the RF power module on the interlayer dielectric disposed between the secondary line Lin, and the main line Lout, of the transmission line transformer TLT. That is, taking into consideration a possibility of a crack occurring to the interlayer dielectric due to the pressure exerted by the wire bonder, or electrical insulation properties of the interlayer dielectric undergoing deterioration due to occurrence of a crack, the joint CP of the bonding pad is formed so as to be isolated from the energy transmission coupling part.

For the first and second reasons described as above, the joint CP of the bonding pad was formed so as to be isolated from the energy transmission coupling part for the inductive-capacitive coupling, between the transmission line of the main line Lout, and the transmission line of the secondary line Lin, of the transmission line transformer TLT, however, reviews by the inventor, et al. revealed that there existed a new problem.

The problem is that despite the fact that the joint CP of the bonding pad was formed so as to be isolated from the energy transmission coupling part in accordance with consideration taken as described in the foregoing, it was found impossible to obtain impedance matching even if use was made of the transmission line transformer TLT shown in FIG. 1, as the impedance matching circuit disposed between the output of the RF power amplifier, and the input of the antenna, contrary to earlier expectation. As a result of the reviews made by the inventor, et al., on the cause of impedance mismatching, the following matters were revealed.

FIG. 2 is a view showing an equivalent circuit of the final amplification stage of the RF power amplifier shown in FIG. 1, comprising the power hetrojunction bipolar transistor (HBT) Q, and the transmission line transformer TLT.

As shown in FIG. 2, an output capacitor Cout is coupled between the output terminal Out (A) of the main line Lout of the transmission line transformer TLT, and a ground potential GND. Further, an input capacitor Cin is coupled between the input terminal In (A) of the main line Lout of the transmission line transformer TLT, and the ground potential GND, and a bypass capacitor Cpass is coupled between an AC grounding node (a node where the operating voltage Vcc is fed) of the secondary line Lin of the transmission line transformer TLT, and a ground potential. As shown in FIG. 2, in particular, there exists an addition inductor Ladd caused by non-negligible parasitic inductance occurring to the joint CP of the bonding pad between the collector output electrode of the power hetrojunction bipolar transistor (HBT) Q, and the input terminal In (A) of the main line Lout of the transmission line transformer TLT. As a result of the reviews conducted by the inventor, et al., it has become evident that the parasitic inductance of the main line Lout of the transmission line transformer TLT, and parasitic inductance of the secondary line Lin do not cause impedance mismatching, however, the non-negligible parasitic inductance of the joint CP of the bonding pad does cause the impedance mismatching. Furthermore, with the RF power amplifier shown in FIG. 1, since the joint CP of the bonding pad is positioned so as to be away from, and outside of the main body of the transmission line transformer TLT comprising the main line Lout and the secondary line Lin, a problem has arisen in that an occupied area of the RF power amplifier, over the main surface of the circuit board CB, becomes larger in size.

FIG. 3 is a view showing a Smith chart for analyzing a state of impedance matching of the transmission line transformer TLT between an output of the final amplification stage of the RF power amplifier shown in FIGS. 1, and 2, and an input of the antenna. In the Smith chart shown in FIG. 3, impedance is normalized through division by a load impedance Z0 of the 50-Ω antenna.

In the Smith chart, shown in FIG. 3, a start point Z1 represents an output impedance of the power hetrojunction bipolar transistor (HBT) Q at an output of the final amplification stage of the RF power amplifier, and the output impedance at Z1 is, for example, 5 Ω. Accordingly, a normalized value of the impedance at the start point Z1 is 0.1+j 0, corresponding to 0.1 on a straight line of the resistance axis. Subsequently, since the addition inductor Ladd of the joint CP of the bonding pad of the transmission line transformer (TLT) is coupled to the collector output electrode of the power hetrojunction bipolar transistor (HBT) Q, the impedance moves on a 0.1 constant-resistance circle from the start point Z1, along the locus thereof, turning clockwise. In the case of the RF power amplifier shown in FIG. 1, the joint CP of the bonding pad at the input terminal In (A) of the main line Lout of the transmission line transformer (TLT) is substantially 800 μm in length, and the addition inductor Ladd is 0.35 nH in inductance. As a result, a normalized value of the impedance at a first move-destination point Z2 is 0.1+j 0.2.

Next, since the secondary line Lin of the transmission line transformer TLT is coupled to the addition inductor Ladd, the impedance is caused to move along the locus thereof, turning counterclockwise, from the first move-destination point Z2 to a second move-destination point Z3 where a normalized value of the impedance is, for example, 0.08+j 0.1 by the agency of the parasitic inductance of the secondary line Lin. Further, by the agency of the parasitic inductance of the main line Lout of the transmission line transformer (TLT), the impedance is caused to move along the locus thereof, turning clockwise, from the second move-destination point Z3, to a third move-destination point Z4 where a normalized value of the impedance is 0.04+j 0.15.

Then, the impedance is caused to move from the third move-destination point Z4 by the transmission line transformer TLT having a transformation ratio of 1:4 to a fourth move-destination point Z5 where the real part and the imaginary part of a normalized value of the impedance at the third move-destination point Z4 are each increased to 0.16+j 0.6 by a factor of four. Further, since the output capacitor Cout 20 pF in capacitance is coupled to the output terminal Out (A) of the main line Lout of the transmission line transformer TLT, the impedance is caused to finally move along the locus thereof, turning clockwise, from the fourth move-destination point Z5 to a fifth move-destination point Z6 where a normalized value of the impedance is, for example, 2.0+j·0.

When a final move-destination point as a target is a load impedance Z0 of the 50-Ω antenna, the normalized value of the impedance, at the actual and final move-destination point Z6, in the Smith chart shown in FIG. 3, is found at 2.0+j·0, substantially corresponding to 100 Ω. As is well known, reflection coefficient Γ is expressed as follows, and reflection power is not turned to 0, so that it is not possible to obtain a condition for the impedance matching as targeted.

$$\Gamma = (Z6-Z0)/(Z6+Z0) = -0.5 \qquad \text{(expression 1)}$$

Further, FIG. 7 is a top view of the main surface of the circuit board CB of the RF power module shown in FIG. 1. In FIG. 7, RF power fed from the collector output electrode CBP of the power hetrojunction bipolar transistor (HBT) Q to the one end In (A) of the main line Lout of a transmission line transformer TLT is transmitted in a clockwise direction to the other end Out (A) of the main line Lout. Further, the RF power fed from the collector output electrode CBP of the power hetrojunction bipolar transistor (HBT) Q to the other end Lin (A) of the secondary line Lin of the transmission line transformer TLT through the intermediary of a through-connection interconnection Th is transmitted in a counterclockwise direction to the operating voltage Vcc at the one end Lin (B) of the secondary line Lin.

The invention has been developed as a result of the review as described in the foregoing, conducted by the inventor, et al. prior to the development of the invention. It is therefore an object of the invention to maintain a condition for impedance matching of a transmission line transformer upon coupling of an output electrode of a power transistor in the final amplifying stage of an RF amplifying device with the transmission line transformer as an impedance matching circuit.

The above and other objects, features and advantages of the present invention will be apparent from the following detailed description of the preferred embodiments of the invention in conjunction with the accompanying drawings.

A representative embodiment among embodiments of the invention, disclosed under the present application, is briefly described as follows.

More specifically, an RF amplifying device according to the representative embodiment of the invention, the RF amplifying device comprises a power transistor (Q) for generating transmission power to be fed to an antenna of a wireless device, and a transmission line transformer (TLT) coupled to an output electrode (CBP) of the power transistor.

The transmission power from the output electrode of the power transistor is fed to one end {In (A)} of a main line (Lout) of the transmission line transformer (TLT), and one end {Lin (B)} of a secondary line (Lin) of the transmission line transformer (TLT) is coupled to an AC grounding node. The other end {Lin (B)} of the secondary line is coupled to the one end of the main line, thereby generating the transmission power to be fed to the antenna from the other end of the main line. Coupling energy is transmitted from the secondary line to the main line at an energy coupling part where the main line of the transmission line transformer is in close proximity of, and opposite to the secondary line.

The RF amplifying device has a feature in that coupling members (BW) electrically coupled to the output electrode of the power transistor are electrically coupled to a joint (CP) formed in either the main line, or the secondary line, at part of the energy coupling part (refer to FIG. 4).

An advantageous effect obtained by the representative embodiment among the embodiments of the invention, disclosed under the present application, is briefly described as follows.

That is, a condition for impedance matching of the transmission line transformer can be maintained when the output electrode of the power transistor in the final amplifying stage is joined with the transmission line transformer serving as the impedance matching circuit.

DETAILED DESCRIPTION OF THE REFERRED EMBODIMENTS

Representative Embodiment of the Invention

Figure 1:
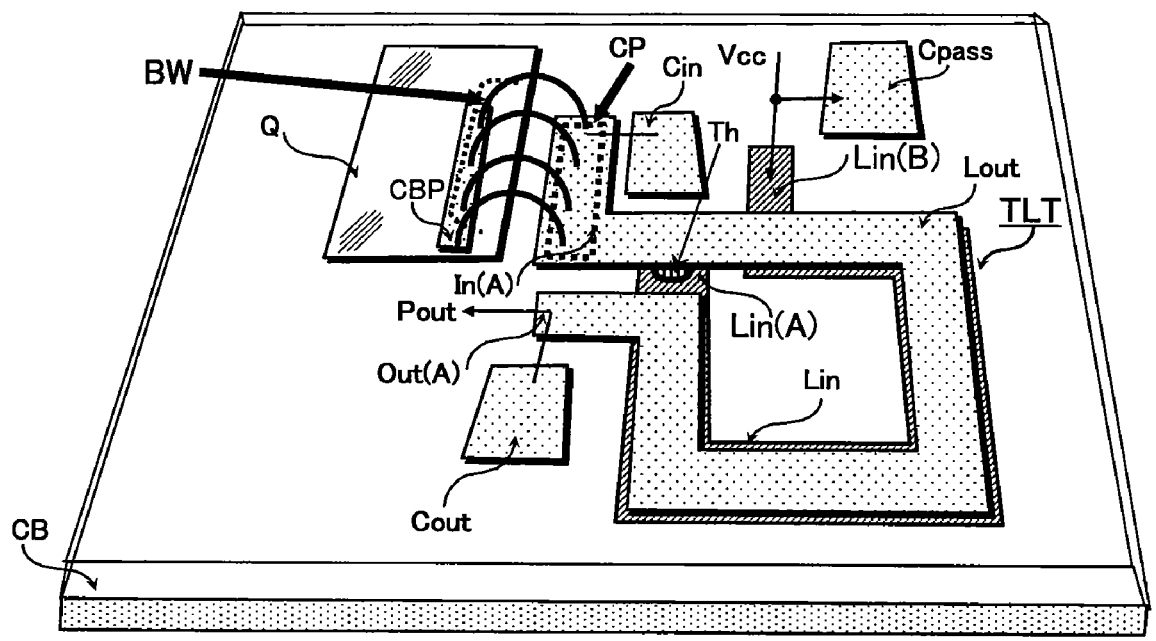
FIG. 1 is a circuit diagram showing a transmission line type matching circuit under review by the inventor, et al. prior to development of the invention.

First, the overview of a representative embodiment of the invention, disclosed under the present application, is described hereinafter. It is to be understood that a reference numeral inside the parentheses, referred to in the drawings, in description of the overview of the representative embodiment of the invention, simply indicates what is included in the concept of a constituent element with the reference numeral affixed thereto, by way of example.

[1] An RF amplifying device according to the representative embodiment of the invention comprises a power transistor (Q) for generating transmission power to be fed to an antenna of a wireless device, and a transmission line transformer (TLT) coupled to an output electrode (CBP) of the power transistor.

The transmission line transformer includes a main line (Lout), and a secondary line (Lin). The transmission power from the output electrode of the power transistor is fed to one end {In (A)} of the main line, and one end {Lin (B)} of the secondary line Lin is coupled to an AC grounding node. The other end {Lin (A)} of the secondary line is coupled to the one end of the main line, thereby generating the transmission power to be fed to the antenna from the other end {Out (A)} of the main line. At an energy coupling part where the main line of the transmission line transformer is in close proximity of, and opposite to the secondary line, coupling energy is transmitted from the secondary line Lin to the main line.

Figure 4:
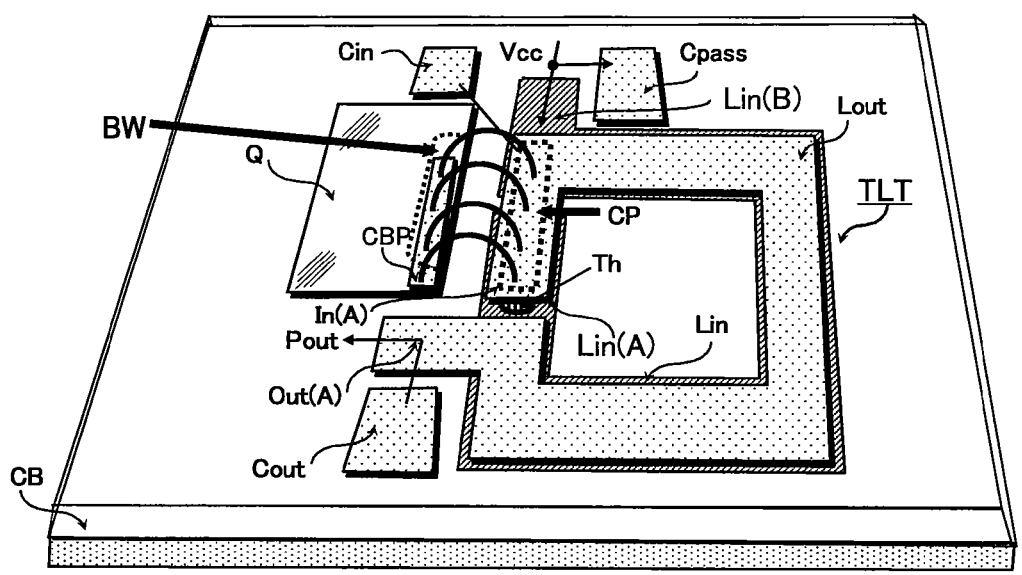
FIG. 4 is a view showing an RF power amplifier incorporated in an RF power module according to one embodiment of the invention.

The RF amplifying device according to the representative embodiment of the invention has a feature in that coupling members (BW) electrically coupled to the output electrode of the power transistor are electrically coupled to a joint (CP) formed in either the main line, or the secondary line, at part of the energy coupling part (refer to FIG. 4).

Figure 6:
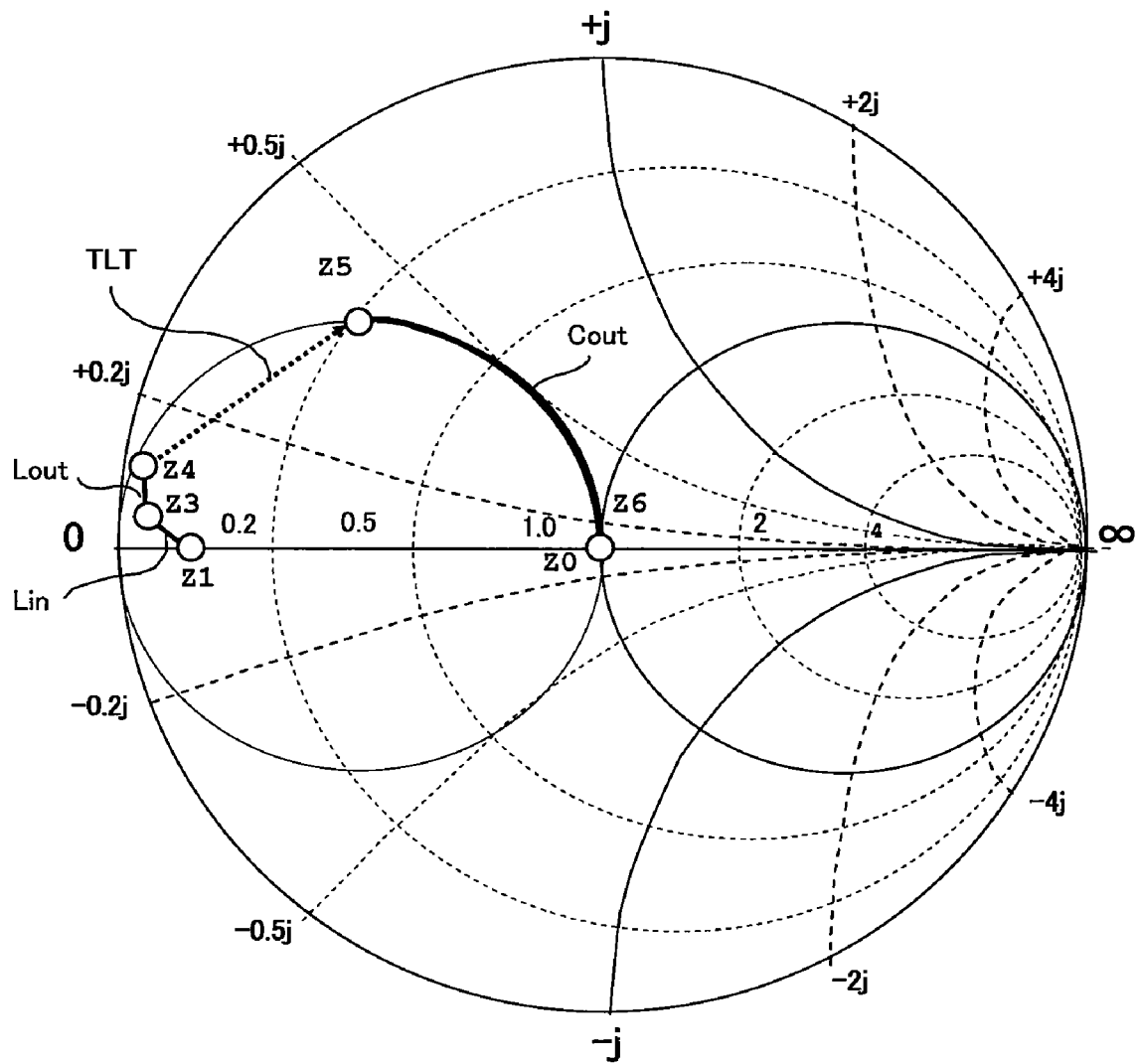
FIG. 6 is a view showing a Smith chart for analyzing a state of impedance matching of the transmission line transformer TLT between the output of the final amplification stage of the RF power amplifier according to the one embodiment of the invention, shown in FIGS. 4, and 5, and the input of the antenna.
Figure 7:
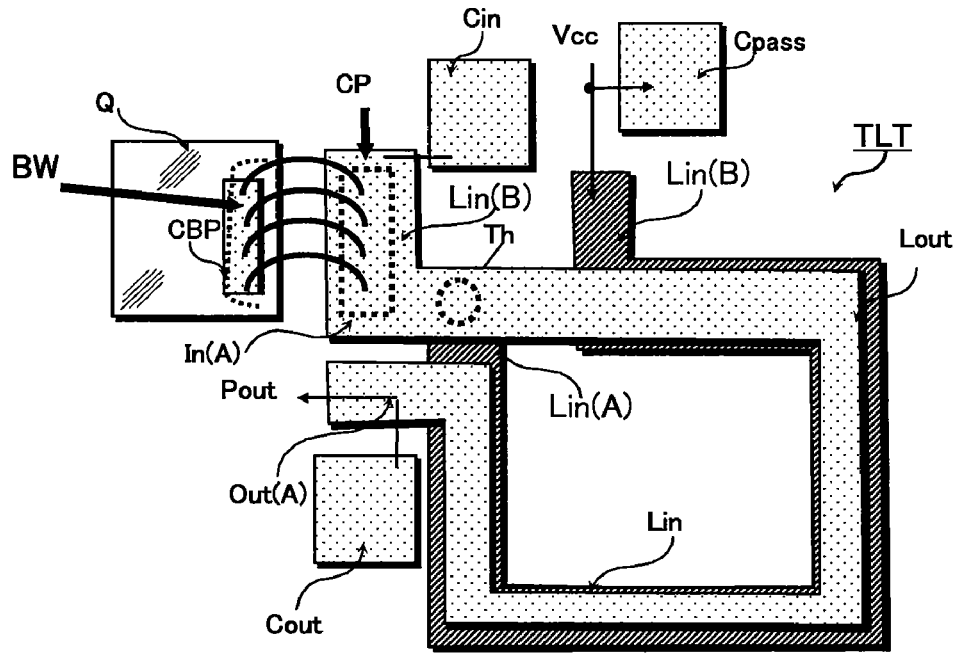
FIG. 7 is a top view of the main surface of the circuit board CB of the RF power module shown in FIG. 1.

With the present embodiment, parasitic inductance occurring between the output electrode of the power transistor and the input terminal In (A) of the main line can be significantly reduced, thereby enabling the condition for impedance matching of the transmission line transformer (TLT) to be maintained (refer to FIG. 6).

With an RF amplifying device according to a preferred embodiment of the invention, an operating voltage Vcc differing in level from a ground voltage level is applied to the AC grounding node at the one end of the secondary line, thereby causing the operating voltage to be fed to the output electrode of the power transistor via the secondary line.

With an RF amplifying device according to a more preferred embodiment of the invention, both the main line and the secondary line Lin of the transmission line transformer are configured of multilevel interconnections formed over an insulated board (CB).

With an RF amplifying device according to a still more preferred embodiment of the invention, the power transistor is formed over a semiconductor chip, and the coupling members electrically coupled to the output electrode of the power transistor formed over the semiconductor chip are either bonding wires (BW), or bonding balls (BB). The joint formed in the part of the energy coupling part, electrically coupled to the coupling members (BW), is a bonding pad joint (CP).

Figure 11:
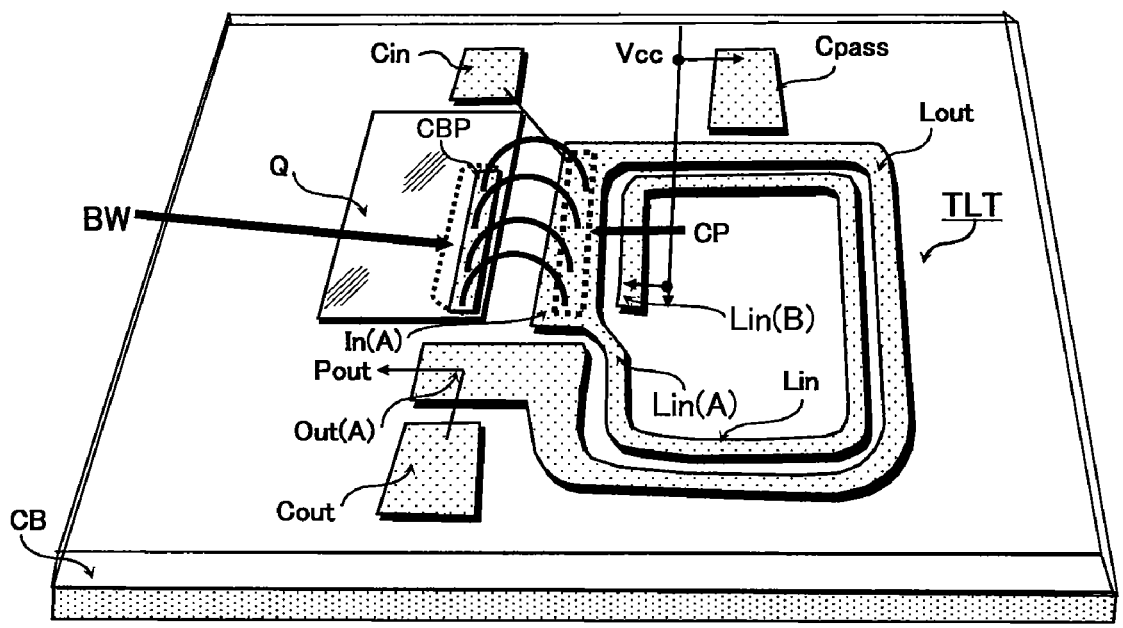
FIG. 11 is a view showing an RF power amplifier incorporated in an RF power module according to a further embodiment of the invention.

With another RF amplifying device according to a further preferred embodiment of the invention, both the main line and the secondary line of the transmission line transformer are formed of a common interconnection layer in the shape of a spiral in a single layer (refer to FIG. 11).

Figure 12:
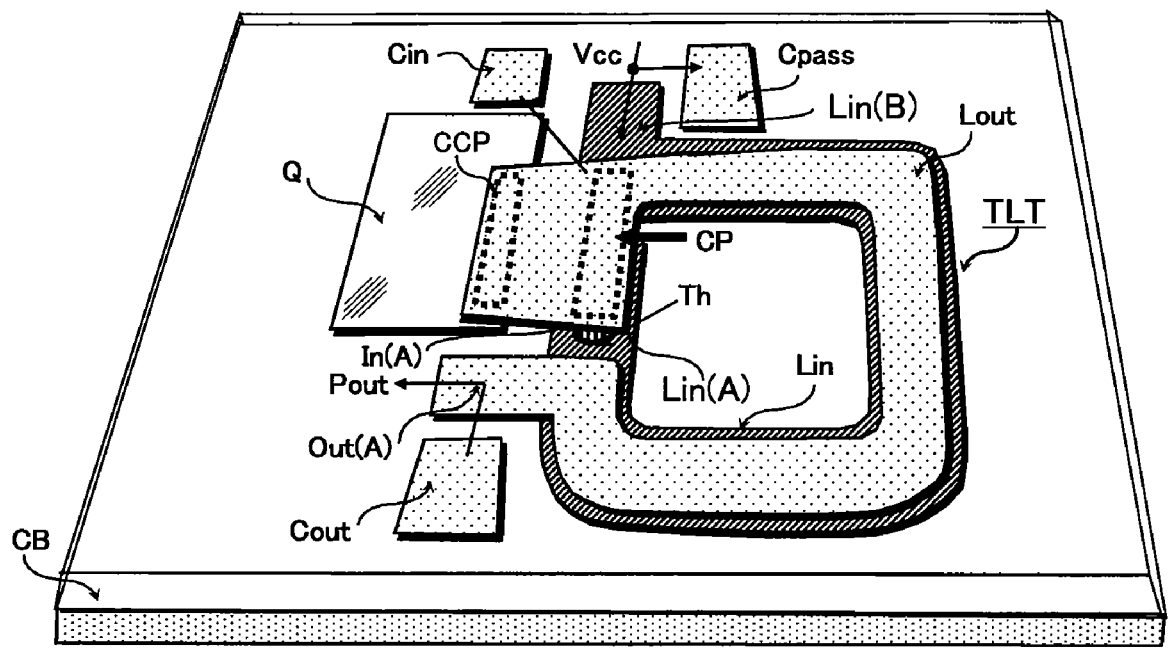
FIG. 12 is a view showing an RF power amplifier incorporated in an RF power module according to a still further embodiment of the invention.

With an RF amplifying device according to a specific embodiment of the invention, the power transistor, and both the main line and the secondary line of the transmission line transformer are formed over a semiconductor substrate of a monolithic microwave integrated circuit (refer to FIG. 12).

With an RF amplifying device according to another specific embodiment of the invention, the power transistor is either a hetrojunction bipolar transistor, or an LDMOS.

[2] An RF amplifying device (RF_PAM) according to still another embodiment of the invention comprises a first power amplifier (HPA1) for amplifying a first RF transmission input signal (Pin_LB) having a first frequency band, and a second power amplifier (HPA2) for amplifying a second RF transmission input signal (Pin_HB) having a second frequency band higher in frequency than the first frequency band.

The first power amplifier includes a first power transistor (Q12) for generating a first transmission input power (Pout_LB) to be fed to an antenna of a wireless device by amplifying the first RF transmission input signal, and a first transmission line transformer (TLT12) coupled to a first output electrode of the first power transistor.

The second power amplifier includes a second power transistor (Q22) for generating a second transmission power (Pout_HB) to be fed to the antenna of the wireless device by amplifying the second RF transmission input signal, and a second transmission line transformer (TLT22) coupled to a second output electrode of the second power transistor.

The first transmission line transformer, and the second transmission line transformer each include a main line (Lout) and a secondary line (Lin), respectively. The transmission power from the output electrode of the power transistor is fed to one end {In (A)} of the main line, and one end {Lin (B)} of the secondary line is coupled to an AC grounding node. The other end {Lin (A)} of the secondary line is coupled to the one end of the main line, thereby generating the transmission power to be fed to the antenna from the other end {Out (A)} of the main line. At an energy coupling part of each of the transmission line transformers, where the main line of the transmission line transformer is in close proximity of, and opposite to the secondary line thereof, coupling energy is transmitted from the secondary line to the main line.

The RF amplifying device described as above has a feature in that coupling members (BW) electrically coupled to the output electrode of the power transistor are electrically coupled to a joint (CP) formed in either the main line, or the secondary line, at part of the energy coupling part (refer to FIGS. 4, and 12).

With an RF amplifying device according to a preferred embodiment of the invention, an operating voltage Vdd differing in level from a ground voltage level is applied to the AC grounding node at the one end of the secondary line of each of the transmission line transformers, thereby causing the operating voltage to be fed to the output electrode of the power transistor via the secondary line.

With an RF amplifying device according to a more preferred embodiment of the invention, both the main line and the secondary line of each of the transmission line transformers are made up of multilevel interconnections formed over an insulated board (CB).

With another RF amplifying device according to a more preferred embodiment of the invention, the respective power transistors, and both the main line and the secondary line of each of the transmission line transformers are formed over a semiconductor substrate of a monolithic microwave integrated circuit (refer to FIG. 12).

With an RF amplifying device according to a still more preferred embodiment of the invention, the power transistors each are formed over a semiconductor chip, and the coupling members electrically coupled to the output electrode of each of the power transistors formed over the semiconductor chip are either bonding wires (BW), or bonding balls (BB). The joint formed in the part of the energy coupling part electrically coupled to the coupling members (BW) is a bonding pad joint (CP) formed over insulated board (CB).

Figure 13:
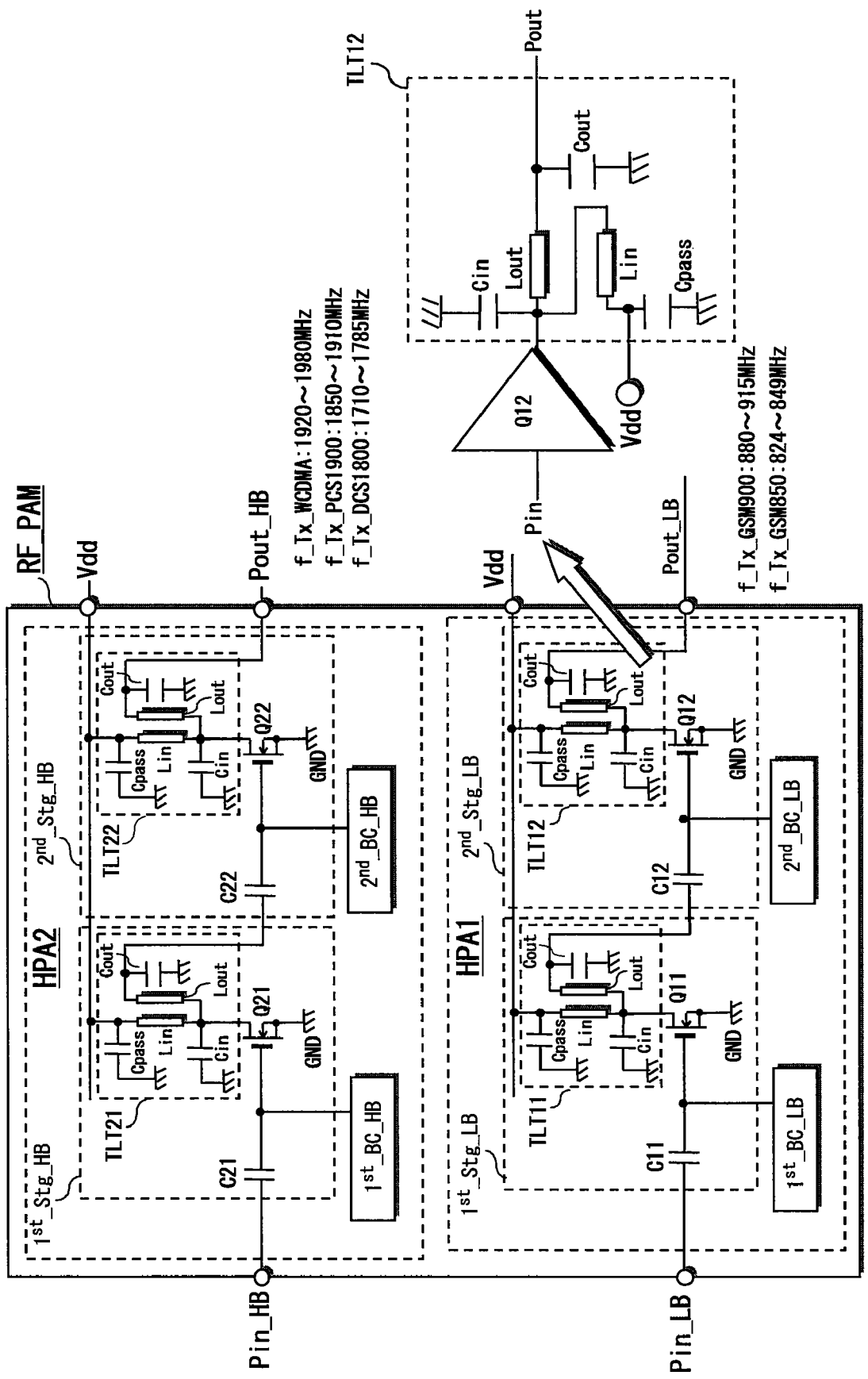
FIG. 13 is a circuit diagram showing an RF power module incorporating an RF power amplifier according to a specific embodiment of the invention.

With an RF amplifying device according to a specific embodiment of the invention, the first RF transmission input signal is either GSM850 or GSM900, and the second RF transmission input signal is any of DCS1800, PCS1900, and WCDMA1900 (refer to FIG. 13).

With an RF amplifying device according to another specific embodiment of the invention, the power transistors each are either a hetrojunction bipolar transistor, or an LDMOS.

[3] An RF amplifying device (RE_PAM1) according to a further embodiment of the invention comprises first and second power transistors (Q1, Q2) for generating transmission power to be fed to an antenna of a wireless device, a stripline (OUT_SL_LB) for output synthesizing, having first and second inputs coupled to first and second output electrodes of the first and second power transistors, respectively, and a transmission line transformer (TLT12) coupled to an output of the stripline for output synthesizing.

The transmission line transformer includes a main line (Lout), and a secondary line (Lin). The transmission power from the output of the stripline for output synthesizing is fed to one end {In (A)} of the main line, and one end {Lin (B)} of the secondary line is coupled to an AC grounding node. The other end {Lin (A)} of the secondary line is coupled to the one end of the main line, thereby generating the transmission power to be fed to the antenna from the other end {Out (A)} of the main line. At an energy coupling part where the main line of the transmission line transformer is in close proximity of, and opposite to the secondary line thereof, coupling energy is transmitted from the secondary line to the main line.

Figure 14:
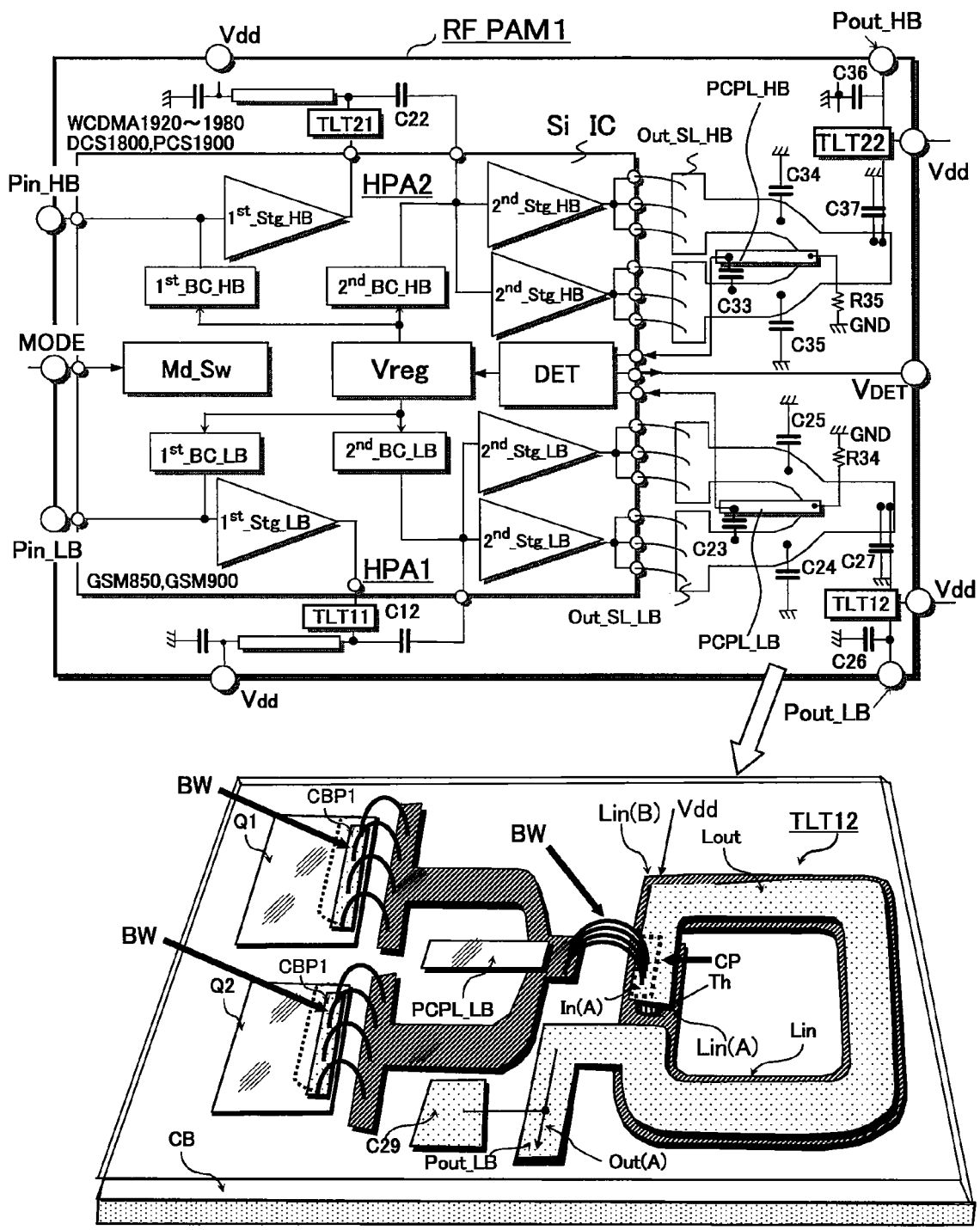
FIG. 14 is a view showing a specific configuration of an RF power module according to another specific embodiment of the invention.

The RF amplifying device according to the further embodiment of the invention has a feature in that coupling members (BW) electrically coupled to the output of the stripline for output synthesizing are electrically coupled to a joint (CP) formed in either the main line, or the secondary line, at part of the energy coupling part (refer to FIG. 14).

With an RF amplifying device according to a preferred embodiment of the invention, an operating voltage (Vdd) differing in level from a ground voltage level is applied to the AC grounding node at the one end {Lin (B)} of the secondary line, thereby causing the operating voltage to be fed to the first and second output electrodes of the first and second power transistors, respectively, via the secondary line, and the stripline for output synthesizing.

With an RF amplifying device according to a more preferred embodiment of the invention, both the main line and the secondary line of the transmission line transformer are made up of multilevel interconnections formed over an insulated board (CB).

With another RF amplifying device according to a more preferred embodiment of the invention, the respective power transistors, and both the main line and the secondary line of each of the transmission line transformers are formed over a semiconductor substrate of a monolithic microwave integrated circuit (refer to FIG. 12).

With an RF amplifying device according to a still more preferred embodiment of the invention, the first and second power transistors are formed over a semiconductor chip. The first and second output electrodes of the first and second power transistors, formed over the semiconductor chip, are coupled to the first and second inputs of the stripline for output synthesizing, respectively, via first bonding wires (BW), and second bonding wires (BW), respectively. The output of the stripline for output synthesizing is coupled to the one end {In (A)} of the main line via a fourth bonding wire (BW).

With an RF amplifying device according to a specific embodiment of the invention, the first and second power transistors each are either a hetrojunction bipolar transistor, or an LDMOS.

Description of Embodiments of the Invention

Next, the embodiments of the invention are described in more detail hereinafter.

RF Module According to One Embodiment of the Invention

FIG. 4 is a view showing an RF power amplifier incorporated in an RF power module according to one embodiment of the invention.

The RF power amplifier of the RF power module, shown in FIG. 4, is basically identical to the RF power amplifier of the RF power module reviewed by the inventor, et al. prior to the development of the invention, as shown in FIG. 1, except for a structure for joining the collector output electrode of the power hetrojunction bipolar transistor with the transmission line transformer TLT.

That is, with the RF power amplifier of the RF power module, shown in FIG. 4, a joint CP of a bonding pad for four bonding wires is formed in an energy transmission coupling part where the main line Lout of the transmission line is in close proximity of, and opposite to the secondary line thereof. In the energy transmission coupling part, an inductive-capacitive coupling energy is transmitted from the secondary line Lin to the main line Lout. More specifically, in FIG. 4, the main line Lout of the transmission line transformer TLT, formed of an upper layer interconnection of multilevel interconnections, is provided above the secondary line Lin of the transmission line transformer TLT, formed of a lower layer interconnection of the multilevel interconnections, thereby forming the energy transmission coupling part between the secondary line Lin in a lower layer, and the main line Lout in an upper layer. That is, part of the main line Lout of the transmission line transformer TLT, formed of the upper layer interconnection of the multilevel interconnections, in the upper part of the energy transmission coupling part, is formed as the joint CP of the bonding pad for the four bonding wires coupled to collector output electrodes CBP of the power hetrojunction bipolar transistor Q, respectively. Further, the part of the main line Lout of the transmission line transformer TLT, as the joint CP of the bonding pad, is also one end In (A) of the main line Lout of the transmission line transformer TLT, an RF collector output signal of the power hetrojunction bipolar transistor (HBT) Q being fed thereto. Further, transmission power to be fed to a 50-Ω antenna (not shown) of a cellular telephone is outputted from an output terminal Pout of the RF power module.

Figure 2:
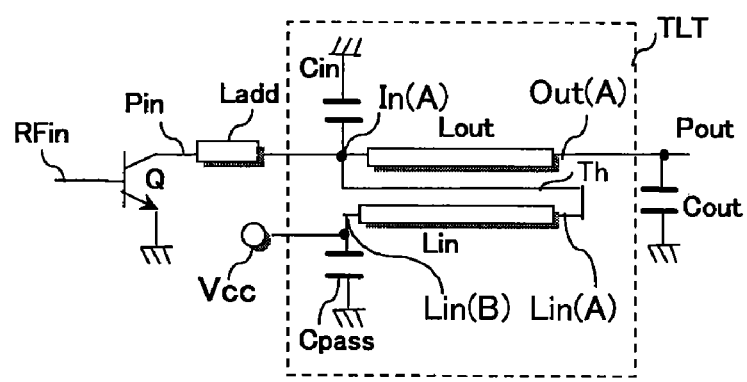
FIG. 2 is a view showing an equivalent circuit of the final amplification stage of an RF power amplifier shown in FIG. 1, the RF power amplifier comprising a hetrojunction bipolar transistor, and a transmission line transformer TLT.
Figure 3:
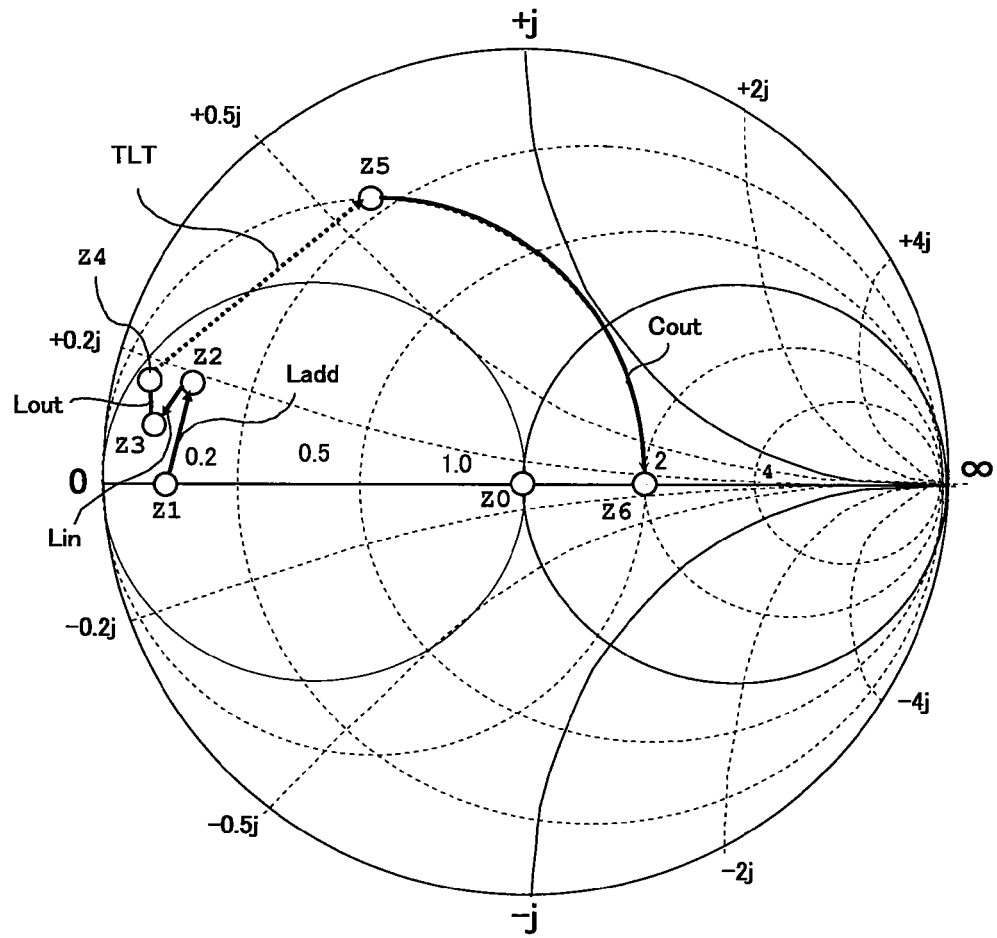
FIG. 3 is a view showing a Smith chart for analyzing a state of impedance matching of the transmission line transformer between an output of the final amplification stage of the RF power amplifier shown in FIGS. 1, and 2, and an input of an antenna.
Figure 5:
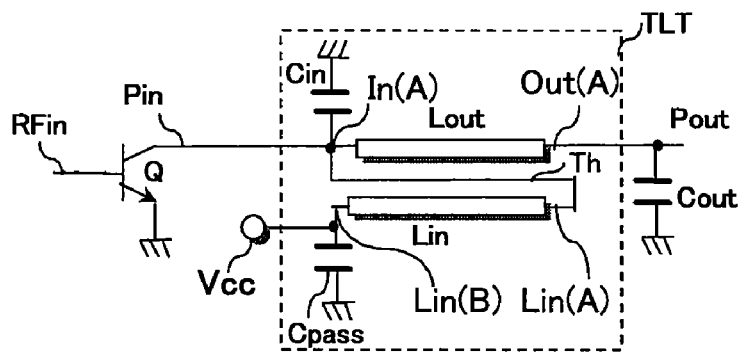
FIG. 5 is a view showing an equivalent circuit of the final amplification stage of the RF power amplifier shown in FIG. 4, including the hetrojunction bipolar transistor, and the transmission line transformer.

FIG. 5 is a view showing an equivalent circuit of the final amplification stage of the RF power amplifier shown in FIG. 4, including the power hetrojunction bipolar transistor (HBT) Q, and the transmission line transformer TLT. Accordingly, with the RF power amplifier of the RF power module, shown in FIG. 4, it has become possible to significantly reduce parasitic inductance occurring to the joint CP of the bonding pad between the collector output electrode of the power hetrojunction bipolar transistor (HBT) Q, and the input terminal In (A) of the main line Lout of the transmission line transformer TLT, as compared with that shown in FIGS. 1 and 2. That is, parasitic inductance between the collector output electrode of the power hetrojunction bipolar transistor (HBT) Q, and the one end In (A) of the main line Lout of the transmission line transformer TLT will be only low parasitic inductance caused by the four bonding wires BW coupled in parallel. As a result, upon joining the collector output electrode of the power hetrojunction bipolar transistor (HBT) Q with the transmission line transformer TLT as the impedance matching circuit, it becomes possible to maintain the condition for impedance matching.

Now, review is hereinafter made on impedance conversion of the transmission line transformer TLT, due to input impedance Zin and output impedance Zout of the transmission line transformer TLT shown in FIGS. 4, and 5, respectively. Herein, respective characteristic impedances of the main line Lout, and the secondary line of the transmission line transformer TLT are designated as Zo. When an input voltage Vin is inputted to the one end In (A) of the main line Lout of the transmission line transformer TLT as an input terminal of the transmission line transformer TLT, the input voltage Vin is applied between and an AC grounding node (a node where the operating voltage Vcc is fed) of one end Lin (B) of the secondary line Lin of the transmission line transformer TLT, and the other end Lin (A) of the secondary line Lin. Then, a voltage substantially equal to the input voltage Vin is induced between the one end In (A) of the main line Lout of the transmission line transformer TLT, and the other end Out (A) of the main line Lout by the agency of the inductive capacitive coupling energy transmitted from the secondary line Lin of the transmission line transformer TLT to the main line Lout. An output voltage Vout of the other end Out (A) of the main line Lout, as an output terminal of the transmission line transformer TLT, is therefore found b the following expression:

$$\text{Vout} \approx 2\,\text{Vin} \qquad \text{(expression 2)}$$

Meanwhile, the input impedance Zin of the transmission line transformer TLT, as seen from the one end In (A) of the main line Lout of the transmission line transformer TLT, as the input terminal of the transmission line transformer TLT, with the other end Out (A) of the main line Lout, as the output terminal of the transmission line transformer TLT, in as-shorted state, is found by the following expression:

$$Zin = Zo/2 \quad \text{(expression 3)}$$

Meanwhile, the output impedance Zout of the transmission line transformer TLT, as seen from the other end Out (A) of the main line Lout, as the output terminal of the transmission line transformer TLT, with the one end In (A) of the main line Lout of the transmission line transformer TLT, as the input terminal of the transmission line transformer TLT, in as-opened state, is found by the following expression:

$$Zout = 2\,Zo \quad \text{(expression 4)}$$

Accordingly, a ratio of the input impedance Zin of the transmission line transformer TLT to the output impedance Zout is 1:4, so that an impedance conversion ratio (the transformation ratio) of the transmission line transformer TLT shown in FIGS. 4, and 5 is found at 1:4.

FIG. 6 is a view showing a Smith chart for analyzing a state of impedance matching of the transmission line transformer TLT between the output of the final amplification stage of the RF power amplifier according to the one embodiment of the invention, shown in FIGS. 4, and 5, and the input of the antenna. Further, in the Smith chart, shown in FIG. 6, as well, impedance is normalized through division by the load impedance Z0 of the 50-Ω antenna.

In the Smith chart, shown in FIG. 6, a start point Z1 represents the output impedance of the power hetrojunction bipolar transistor (HBT) Q at the output of the final amplification stage of the RF power amplifier, and the output impedance at Z1 is, for example, 5 Ω. Accordingly, a normalized value of the impedance at the start point Z1 is 0.1+j·0, corresponding to 0.1 on the straight line of the resistance axis. First, four aluminum bonding wires BW, and the secondary line Lin of the transmission line transformer TLT are coupled to the collector output electrode of the power hetrojunction bipolar transistor (HBT) Q. Accordingly, the impedance is caused to move from the start point Z1 to a first move-destination point Z3 where a normalized value of the impedance is, for example, 0.08+j·0.05 by the agency of low parasitic inductance of the bonding wires BW, and parasitic inductance of the secondary line Lin.

Next, since the main line Lout of the transmission line transformer TLT is coupled to the secondary line Lin of the transmission line transformer TLT, the impedance is caused to move from the first move-destination point Z3 to a second move-destination point Z4 where a normalized value of the impedance is, for example, 0.05+j·0.1 by the agency of the parasitic inductance of the main line Lout.

Subsequently, the impedance is caused to move from the second move-destination point Z4 by the transmission line transformer TLT having the transformation ratio of 1:4 to a third move-destination point Z5 where the real part and the imaginary part of a normalized value of the impedance at the second move-destination point Z4 are each increased to 0.2+j 0.4 by a factor of four. Further, since the output capacitor Cout 20 pF in capacitance is coupled to the output terminal Out (A) of the main line Lout of the transmission line transformer TLT, the impedance is caused to finally move along the locus thereof, turning clockwise, from the third move-destination point Z5 to a fourth move-destination point Z6 where a normalized value of the impedance is, for example, 1.0+j·0.

When a final move-destination point as a target is a load impedance Z0 of the 50-Ω antenna, the normalized value of the impedance, at the actual and final move-destination point Z6 in the Smith chart shown in FIG. 6, is found at 1.0+j·0, substantially corresponding to 50 Ω. Accordingly, reflection coefficient Γ is expressed as follows, and reflection power is substantially turned to 0, so that it is possible to obtain the condition for the impedance matching as targeted.

$$\Gamma = (Z6 - Z0)/(Z6 + Z0) \cong 0 \quad \text{(expression 5)}$$

Further, as shown in FIG. 4, the transmission line transformer TLT comprising the main line Lout and the secondary line Lin can be formed of multilevel metalized interconnections formed over the main surface of a circuit board CB of the RF power module made up of a multilevel interconnection ceramic insulated substrate, and so forth. For example, the secondary line Lin of the transmission line transformer TLT is formed of a lower-level metalized interconnection inside the multilevel interconnection ceramic insulated substrate while the main line Lout of the transmission line transformer TLT is formed of the uppermost level metalized interconnection of the multilevel interconnections on the main surface of the multilevel interconnection ceramic insulated substrate, and a configuration reverse to the above may be adopted. An interlayer dielectric (not shown) is disposed between the secondary line Lin formed of the lower-level metalized interconnection, and the main line Lout formed of the uppermost level metalized interconnection. An operating voltage Vcc can be fed to one end Lin (B) of the secondary line Lin formed of the lower-level metalized interconnection, and an input signal from the collector output electrode CBP of the power hetrojunction bipolar transistor (HBT) Q can be fed to the other end Lin (A) of the secondary line Lin. More specifically, the other end Lin (A) of the secondary line Lin is coupled to one end In (A) of the main line Lout of the transmission line transformer TLT through the intermediary of the through-connection interconnection Th formed in the interlayer dielectric. An RF collector output signal of the power hetrojunction bipolar transistor (HBT) Q is fed to the one end In (A) of the main line Lout of the transmission line transformer TLT.

Accordingly, due to impedance conversion from the secondary line Lin of the transmission line transformer TLT to the main line Lout, conversion output power of the power hetrojunction bipolar transistor (HBT) Q can be generated from the other end Out (A) of the main line Lout. That is, characteristic impedance is formed by the agency of the interlayer dielectric disposed between the secondary line Lin of the transmission line transformer TLT and the main line Lout. Accordingly, the inductive-capacitive coupling energy is transmitted from the secondary line Lin of the transmission line transformer TLT in the transmission line mode to the main line Lout. Therefore, it becomes possible to take out an RF amplified voltage signal from an output electrode of an amplifier element without the use of an air-core coil as a load circuit, and without the use of a spiral coil, or choke inductance, having a large current-carrying capacity and a high Q factor.

The power hetrojunction bipolar transistor (HBT) Q is formed over the III - V group compound semiconductor chip, and for the power hetrojunction bipolar transistor (HBT) Q, use is made of the hetrojunction bipolar transistor formed of, for example, GaAs, and InP. Further, as another HBT, use may be made of a hetrojunction bipolar transistor formed of SiGe, as well. Accordingly, the collector output electrode of the power hetrojunction bipolar transistor (HBT) Q is formed of an interconnection layer CBP fabricated on the surface of the III-V group compound semiconductor chip, or a silicon semiconductor chip in a semiconductor manufacturing process. The collector output electrode CBP of the power hetrojunction bipolar transistor (HBT) Q is coupled to a joint CP of the main line Lout as the upper-level interconnection formed over the main surface of the circuit board CB of the RF power module via the four bonding wires BW coupled in parallel. Low parasitic resistance and low parasitic inductance, caused by the four bonding wires BW coupled in parallel, will reduce the voltage drop owing to the collector current of the power hetrojunction bipolar transistor (HBT) Q, on the order of an ampere. In this connection, the joint CP of the main line Lout as the upper-level interconnection is the bonding pad for the four bonding wires BW.

Further, the power hetrojunction bipolar transistor (HBT) Q comprises a plurality of unit HBTs coupled in parallel, emitter-collector paths of the plural unit HBTs, respectively, are coupled in parallel, and base electrodes of the plural unit HBTs, respectively, as well, are coupled in parallel. The power transistor may comprise a plurality of unit power MOS transistors coupled in parallel, source-drain current paths of the plural unit power MOS transistors, respectively, are coupled in parallel, and gate electrodes of the plural unit power MOS transistors, respectively, as well, are coupled in parallel. A semiconductor chip for the power HBTs, or the power MOS transistors is electrically and thermally coupled to the main surface of a metallic radiation structure low in thermal resistance, formed on the multilevel interconnection ceramic insulated substrate, by soldering. The back surface of the metallic radiation structure is electrically and thermally coupled to a grounding interconnection large in area, provided inside a mother board of a cellular telephone, by soldering. For the metallic radiation structure low in thermal resistance, use can be made of a thermal via, or a radiating header. In this case, if the emitter of the power HBT, or the source of the power MOS transistor is electrically coupled to the metallic radiation structure, this will enable the power HBT, or the power MOS transistor to be stably operated as an RF amplifying element with the emitter grounded or an RF amplifying element with the source grounded.

Figure 8:
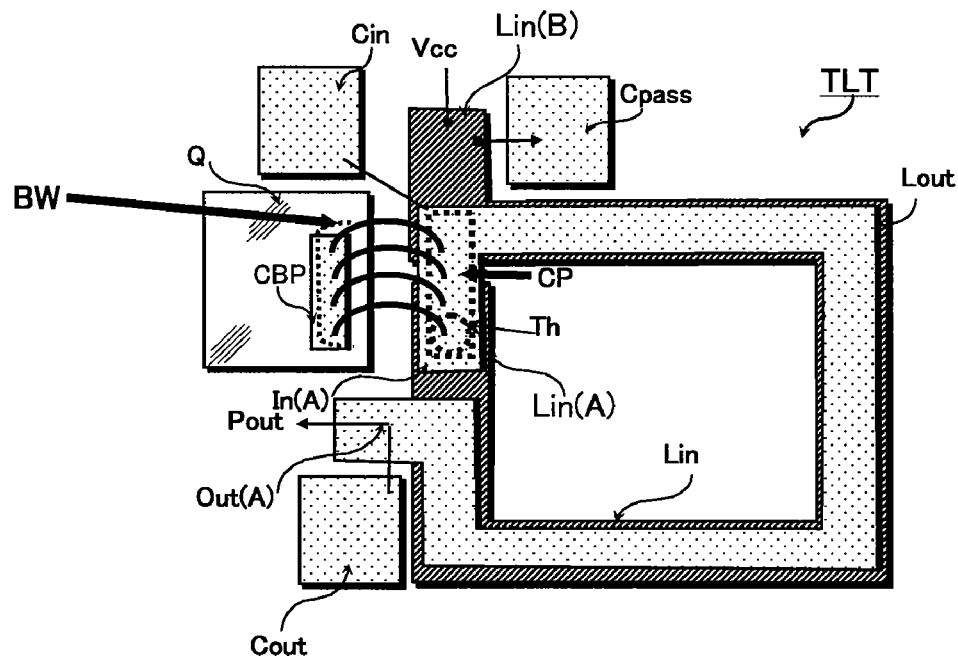
FIG. 8 is a view showing the top face of the main surface of the circuit board CB of the RF power module according to the one embodiment of the invention, shown in FIG. 4.

FIG. 8 is a view showing the top face of the main surface of the circuit board CB of the RF power module according to the one embodiment of the invention, shown in FIG. 4. In FIG. 8, RF power supplied from the collector output electrode CBP of the power hetrojunction bipolar transistor (HBT) Q to one end In (A) of the main line Lout of the transmission line transformer TLT is transmitted in a clockwise direction to the other end Out (A) of the main line Lout. Further, the RF power supplied from the collector output electrode CBP of the power hetrojunction bipolar transistor (HBT) Q to the other end Lin (A) of the secondary line Lin of the transmission line transformer TLT through the intermediary of the through-connection interconnection Th is transmitted in a counter-clockwise direction to the operating voltage Vcc at the one end Lin (B) of the secondary line Lin.

RF Module According to Another Embodiment of the Invention

Figure 9:
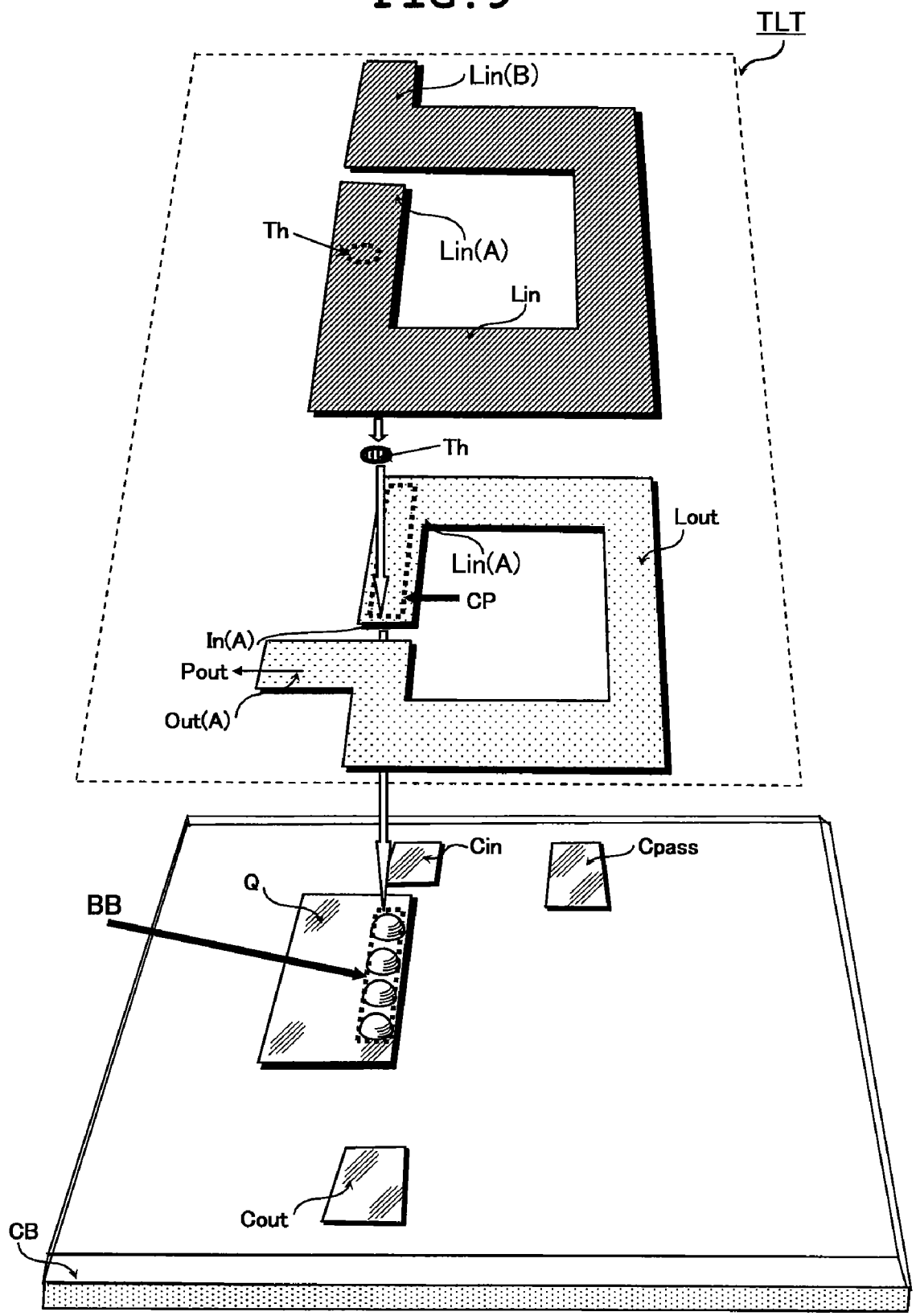
FIG. 9 is a view showing an RF power amplifier incorporated in an RF power module according to another embodiment of the invention.

FIG. 9 is a view showing an RF power amplifier incorporated in an RF power module according to another embodiment of the invention.

With the RF power module shown in FIG. 9, a collector output electrode of a power hetrojunction bipolar transistor Q is coupled to a bonding pad joint CP at a part of the main line Lout of the transmission line transformer TLT via four pieces of bonding balls BB in place of four bonding wires. Further, the part of the main line Lout of the transmission line transformer TLT, serving as the bonding pad joint CP, is also one end In (A) of the main line Lout of the transmission line transformer TLT, an RF collector output signal of the power hetrojunction bipolar transistor (HBT) Q in the final amplification stage of an RF power amplifier being fed to the one end In (A). Still further, a first-level interlayer dielectric (not shown) is formed between the power hetrojunction bipolar transistor (HBT) Q, and the main line Lout of the transmission line transformer TLT, and four openings for the four pieces of the bonding balls (BB), respectively, are formed in the first-level interlayer dielectric.

Furthermore, the one end In (A) of the main line Lout of the transmission line transformer TLT is coupled to the other end Lin (A) of a secondary line Lin of the transmission line transformer TLT via a through-connection interconnection Th formed in a second-level interlayer dielectric at an upper level.

Accordingly, in FIG. 9 as well, RF power that is fed from the collector output electrode of the power hetrojunction bipolar transistor (HBT) Q to the one end In (A) of the main line Lout of the transmission line transformer TLT is transmitted in a clockwise direction to the other end Out (A) of the main line Lout. Further, the RF power that is fed from the collector output electrode of the power hetrojunction bipolar transistor (HBT) Q to the other end Lin (A) of the secondary line Lin of the transmission line transformer TLT via the through-connection interconnection Th is transmitted in a counterclockwise direction to one end Lin (B) of the secondary line Lin. Furthermore, the operating voltage Vcc can be fed to the one end Lin (B) of the secondary line Lin of the transmission line transformer TLT.

Figure 10:
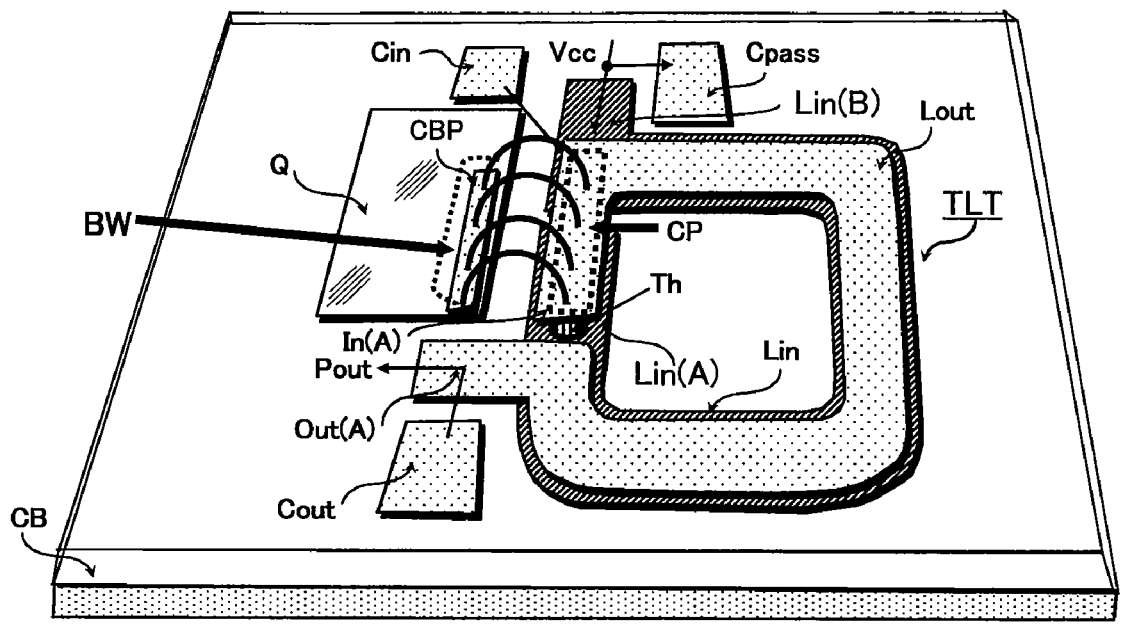
FIG. 10 is a view showing an RF power amplifier incorporated in an RF power module according to still another embodiment of the invention.

FIG. 10 is a view showing an RF power amplifier incorporated in an RF power module according to still another embodiment of the invention. The RF power module shown in FIG. 10 differs from the same shown in FIG. 4 in that respective corner portions of both a main line Lout, and a secondary line Lin of a transmission line transformer TLT formed over the main surface of a circuit board CB of the RF power module are rendered circular in shape, and otherwise, the RF power module shown in FIG. 10 is identical to that according to the embodiment shown in FIG. 4. By so doing, it is possible to reduce radio frequency loss occurring to the respective corner portions when an RF signal flows through both the main line Lout, and the secondary line Lin of the transmission line transformer TLT. Further, not only the respective corner portions but also both the main line Lout, and the secondary line Lin, in whole, may be rendered circular in outer shape.

FIG. 11 is a view showing an RF power amplifier incorporated in an RF power module according to a further embodiment of the invention. The RF power module shown in FIG. 11 differs from the same shown in FIG. 4 in that both a main line Lout, and a secondary line Lin of a transmission line transformer TLT formed over the main surface of a circuit board CB of the RF power module are each formed of a common interconnection layer on the same plane in lace of multilevel interconnections, and otherwise, the RF power module shown in FIG. 11 is identical to that according to the embodiment shown in FIG. 4.

More specifically, with the RF power module shown in FIG. 11, both the main line Lout, and the secondary line Lin of the transmission line transformer TLT are each formed of the common interconnection layer of a single layer, spiral (helical) in shape. Further, one end In (A) of the main line Lout of the transmission line transformer TLT is coupled to the other end Lin (A) of the secondary line Lin of the transmission line transformer TLT through the intermediary of the common interconnection layer. Accordingly, an energy transmission coupling part for inductive capacitive coupling is formed between the main line Lout and the secondary line Lin of the transmission line transformer TLT, formed of the common interconnection layer of the single layer, respectively, in such a way as to be substantially in parallel with each other over the main surface of the circuit board CB of the RF power module. As a result, with the RF power module shown in FIG. 11, as well, the inductive-capacitive coupling energy can be transmitted from the secondary line Lin of the transmission line transformer TLT to the main line Lout as is the case with the RF power module shown in FIG. 4.

Further, in FIG. 11, as well, RF power that is fed from a collector output electrode of the power hetrojunction bipolar transistor (HBT) Q to the one end In (A) of the main line Lout of the transmission line transformer TLT is transmitted in a clockwise direction to the other end Out (A) of the main line Lout. Further, the RF power that is fed from the collector output electrode of the power hetrojunction bipolar transistor (HBT) Q to the other end Lin (A) of the secondary line Lin of the transmission line transformer TLT via the common interconnection layer of the single layer is transmitted in a counterclockwise direction to one end Lin (B) of the secondary line Lin. Furthermore, the operating voltage Vcc is fed to the one end Lin (B) of the secondary line Lin of the transmission line transformer TLT.

FIG. 12 is a view showing an RF power amplifier incorporated in an RF power module according to a still further embodiment of the invention.

With the RF power module shown in FIG. 12, a circuit board CB of the RF power module is a semiconductor substrate in place of the multilevel interconnection ceramic insulated substrate. With a preferred embodiment of the invention, the semiconductor substrate making up the circuit board CB of the RF power module is a GaAs semi-insulating substrate of the III-V group compound semiconductor. Accordingly, the RF power module shown in FIG. 12 is fabricated in the form of a monolithic microwave integrated circuit (MMIC). As shown in FIG. 12, a power hetrojunction bipolar transistor (HBT) Q of GaAs and InP, together with both a main line Lout, and a secondary line Lin of a transmission line transformer TLT, is formed over the GaAs semi-insulating substrate CB of the III-V group compound semiconductor. The secondary line Lin of the transmission line transformer TLT is formed of a lower-level interconnection of multilevel interconnections over the GaAs semi-insulating substrate CB while the mainline Lout of the transmission line transformer TLT is formed of an upper-level interconnection of the multilevel interconnections, and a configuration reverse to the above may be adopted. The secondary line Lin of the transmission line transformer TLT formed of the lower-level interconnection of the multilevel interconnections over the GaAs semi-insulating substrate CB is coupled to the other end Lin (A) of the secondary line Lin of the transmission line transformer TLT, formed of the upper-level interconnection of the multilevel interconnections, via a through-connection interconnection Th. Thus, in FIG. 12, both the main line Lout, and the secondary line Lin of the transmission line transformer TLT can be fabricated by a compound semiconductor manufacturing process.

In FIG. 12, a collector electrode CCP of the power hetrojunction bipolar transistor (HBT) Q, in particular, is coupled to the other end Lin (A) of the secondary line Lin of the transmission line transformer TLT formed of the lower-level interconnection via the upper-level interconnection of the multilevel interconnections, formed in an upper part of the collector electrode CCP.

Accordingly, in FIG. 12, as well, RF power that is fed from the collector output electrode of the power hetrojunction bipolar transistor (HBT) Q to the one end In (A) of the main line Lout, as the upper level interconnection of the transmission line transformer TLT, is transmitted in a clockwise direction to the other end Out (A) of the main line Lout as the upper level interconnection. Further, the RF power that is fed from the collector output electrode of the power hetrojunction bipolar transistor (HBT) Q to the other end Lin (A) of the secondary line Lin, as the lower-level interconnection of the transmission line transformer TLT via the through-connection interconnection Th is transmitted in a counterclockwise direction to one end Lin (B) of the secondary line Lin, as the lower-level interconnection of the transmission line transformer TLT. Furthermore, the operating voltage Vcc is fed to the one end Lin (B) of the secondary line Lin, as the lower-level interconnection of the transmission line transformer TLT.

RF Power Module According to Specific Embodiment of the Invention

FIG. 13 is a circuit diagram showing an RF power module incorporating an RF power amplifier according to a specific embodiment of the invention. As shown in the figure, an RF amplifying device is configured as an RF power module (RF_PAM) integrated into one package.

A first RF transmission input signal Pin_LB, and a second RF transmission input signal Pin_HB from an RF transmit/receive analog signal processing IC (called RFIC) mounted in communication terminal equipment, such as a cellular telephone terminal, are fed to a first power amplifier HPA1, and a second power amplifier HPA2 of the RF power module (RF_PAM), respectively. The first RF transmission input signal Pin_LB has a first frequency band of GSM850 and GSM900, in a range of approximately 0.8 to 1.0 GHz, and the second RF transmission input signal Pin_HB has a second frequency band of any of DCS1800, PCS1900, and WCDMA1900, in a range of approximately 1.7 to 2.0 GHz.

An RF transmission signal of GSM 850 band and an RF transmission signal of GSM 900 band, as the first RF transmission input signal Pin_LB having the first frequency band, are fed to an input of the first power amplifier HPA1. The RF transmission signal of GSM 850 band has a frequency band in a range of 824 to 849 MHz, and the RF transmission signal of GSM 900 band has a frequency band in a range of 880 to 915 MHz.

The RF transmission signal of DCS1800 band, and the RF transmission signal of PCS1900 band, as the second RF transmission input signal Pin_HB having the second frequency band, are fed to an input of the second power amplifier HPA2. Further, the RF transmission signal of WCDMA1900 band, as well, can be fed as the second RF transmission input signal Pin_HB to the input of the second power amplifier HPA2. The RF transmission signal of DCS1800 band has a frequency band in a range of 1710 to 1785 MHz, the RF transmission signal of PCS1900 band has a frequency band in a range of 1850 to 1910 MHz, and the RF transmission signal of WCDMA1900 band has a frequency band in a range of 1920 to 1980 MHz.

With the first power amplifier HPA1, the first RF transmission input signal Pin_LB is amplified by an RF amplifying element Q11 of an input-side amplifier 1st_Stg_LB of a multistage amplifier via a coupling capacitor C11. An RF amplified signal of the input-side amplifier 1st_Stg_LB is amplified by an RF amplifying element Q12 of an output-side amplifier 2nd_Stg_LB of the multistage amplifier via an inter-stage matching circuit comprising a transmission line transformer TLT11. A first RF transmission output signal Pout_LB is obtained from an output of the RF amplifying element Q12 via an output matching circuit comprising a transmission line transformer TLT12. An operating voltage Vdd is fed to an output electrode of the RF amplifying element Q11 of the input-side amplifier 1st_Stg_LB via the transmission line transformer TLT11 serving as the inter-stage matching circuit, and to an output electrode of the RF amplifying element Q12 of the output-side amplifier 2nd_Stg_LB via the transmission line transformer TLT12 serving as the output matching circuit, respectively. A bias voltage developed by an input-side bias circuit 1st_BC_LB is fed to an input electrode of the RF amplifying element Q11 of the input-side amplifier 1st_Stg_LB. A bias voltage developed by an output-side bias circuit 2nd_BC_LB is fed to an input electrode of the RF amplifying element Q12 of the output-side amplifier 2nd_Stg_LB.

With the second power amplifier HPA2, the second RF transmission input signal Pin_HB is amplified by an RF amplifying element Q21 of an input-side amplifier 1st_Stg_HB of a multistage amplifier via a coupling capacitor C21. An RF amplified signal of the input-side amplifier 1st_Stg_HB is amplified by an RF amplifying element Q22 of an output-side amplifier 2nd_Stg_HB of the multistage amplifier via an inter-stage matching circuit comprising a transmission line transformer TLT21. A second RF transmission output signal Pout_HB is obtained from an output of the RF amplifying element Q22 via an output matching circuit comprising a transmission line transformer TLT22. An operating voltage Vdd is fed to an output electrode of the RF amplifying element Q21 of the input side amplifier 1st_Stg_HB via the transmission line transformer TLT21 serving as an inter-stage matching circuit, and to an output electrode of the RF amplifying element Q22 of the output-side amplifier 2nd_Stg_HB via the transmission line transformer TLT22 serving as an output matching circuit. A bias voltage developed by an input-side bias circuit 1st_BC_HB is fed to an input electrode of the RF amplifying element Q21 of the input-side amplifier 1st_Stg_HB. A bias voltage developed by an output-side bias circuit 2nd_BC_HB is fed to an input electrode of the RF amplifying element Q22 of the output-side amplifier 2nd_Stg_HB.

As shown at the bottom right-hand corner in FIG. 13, the transmission line transformer TLT12, serving as the output matching circuit of the RF amplifying element Q12, includes a main line Lout disposed between an input of the transmission line transformer TLT12, and an output Pout thereof, and a secondary line Lin joined with the main line Lout, disposed between either the input, or the output of the transmission line transformer TLT12, and an AC grounding node. An input of the main line Lout of the transmission line transformer TLT12 is coupled to the output electrode of the RF amplifying element Q12. By applying the operating voltage Vdd differing in level from a ground voltage level GND to the AC grounding node of the secondary line Lin, the operating voltage Vdd is fed from the AC grounding node to the output electrode of the RF amplifying element Q12 via the secondary line Lin. An input capacitor Cin, and an output capacitor Cout are coupled to the input and the output of the main line Lout, respectively, and a bypass capacitor Cpass is coupled to the AC grounding node of the secondary line Lin.

With the RF power module shown in FIG. 13, the RF amplifying elements Q11, Q12, Q21, and Q 22 each are an N-channel silicon power MOS transistor suitable for RF amplification, called an LDMOS (Lateral Diffused MOS). Further, with the RF power module shown in FIG. 13, the transmission line transformers TLT11, TLT12, TLT21, and TLT22 each can be configured as with the case of any of the embodiments of the invention, shown in FIGS. 4, 8, 9, 10, 11, and 12, respectively. That is, a joint between the one end In (A) of the main line Lout of the transmission line transformer leading from a drain output electrode of any of the RF amplifying elements Q11, Q12, Q21, and Q 22, and the other end Lin (A) of the secondary line Lin is formed at an energy transmission coupling part between the main line Lout and the secondary line. By so doing, an occupied area of the RF power amplifier, over the main surface of a circuit board CB, can be reduced, and the condition for impedance matching by each of the transmission line transformers TLT12, TLT22, as an impedance matching circuit, against the antenna, can be maintained.

FIG. 14 is a view showing a specific configuration of an RF power module RF_PAM1 according to another specific embodiment of the invention.

As shown in the figure, the RF power module RF_PAM1 according to another specific embodiment of the invention is integrated into one package. N-channel LDMOS transistors as RF amplifying elements, and internal circuits for power control, and bias control are formed over a chip of one silicon semiconductor IC Si IC. A first RF power amplifier HPA1 for transmission of GSM850 and GSM900 is disposed in a lower part inside the chip of the silicon semiconductor IC Si IC. A second RF power amplifier HPA2 for transmission of DCS1800, PCS1900, and WCDMA1900 is disposed in an upper part inside the chip. Disposed at the center inside the chip are a power detector DET, a voltage regulator Vreg, and a mode switch control circuit Md_SW, to which a mode signal MODE is fed. The silicon semiconductor IC Si IC is disposed over a circuit board of the RF power module RF_PAM1. Transmission line transformers TLT11, TLT12, TLT21, TLT22, each serving as a matching circuit, a number of passive elements such as capacitive elements C12, C22, ..., two units of power couplers PCPL_LB, PCPL_HB, two units of output striplines OUT_SL_LB, OUT_SL_HB, and so forth are also disposed over the circuit board. The transmission line transformers TLT11, TLT12, TLT21, TLT22 are formed by utilizing the multilevel interconnections formed over the circuit board, respectively, as previously described. The coupler PCPL_LB is for detection of a transmission output level of the first RF power amplifier HPA1, and the coupler PCPL_HB is for detection of a transmission output level of the second RF power amplifier HPA2. The stripline OUT_SL_LB for Y-connection output synthesizing, formed by use of a lower-level interconnection of the multilevel interconnections, is electromagnetically coupled to the coupler PCPL_LB, formed by use of an upper-level interconnection of the multilevel interconnections, whereupon the coupler PCPL_LB detects the transmission output level of the first RF power amplifier HPA1. The coupler PCPL_LB has one end coupled to a ground voltage GND via a terminal resistor R34, and a transmission output level of the other end of coupler PCPL_LB is fed to the power detector DET. Variation in the transmission output level will result in variation in respective outputs of the power detector DET, and the voltage regulator Vreg, whereupon APC control of the first RF power amplifier HPA1 is executed by the agency of variation in respective bias voltages of an input side bias circuit 1st_BC_LB and an output side bias circuit 2nd_BC_LB. The stripline OUT_SL_HB for Y-connection output synthesizing, formed by use of a lower-level interconnection of the multilevel interconnections, is electromagnetically coupled to the coupler PCPL_HB, formed by use of an upper-level interconnection of the multilevel interconnections, whereupon the coupler PCPL_HB detects the transmission output level of the second RF power amplifier HPA2. The coupler PCPL_HB has one end coupled to the ground voltage GND via a terminal resistor R35, and a transmission output level of the other end of coupler PCPL_HB is fed to the power detector DET. Variation in the transmission output level will result in variation in the respective outputs of the power detector DET, and the voltage regulator Vreg, whereupon APC control of the second RF power amplifier HPA2 is executed by the agency of variation in respective bias voltages of an input side bias circuit 1st_B-C_HB and an output side bias circuit 2nd_BC_HB.

Output-side amplifiers 2nd_Stg_LB of the first RF power amplifier HPA1 are comprised of two units of amplifiers coupled in parallel, and output-side amplifiers 2nd_Stg_HB of the second RF power amplifier HPA2 are similarly comprised of two units of amplifiers coupled in parallel. Two inputs of the two units of the output-side amplifiers 2nd_Stg_LB of the first RF power amplifier HPA1, coupled in parallel, are driven in parallel by an output of an input-side amplifier 1st_Stg_LB, and two inputs of the two units of the output-side amplifiers 2nd_Stg_HB of the second RF power amplifier HPA2, coupled in parallel, are similarly driven in parallel by an output of an input-side amplifier 1st_Stg_HB. Two outputs of the two units of the output-side amplifiers 2nd_Stg_LB of the first RF power amplifier HPA1, coupled in parallel, are fed to two input of the stripline OUT_SL_LB for Y-connection output synthesizing, respectively. A first RF transmission output signal Pout_LB for either GSM850 or GSM900 is sent out from an output of the stripline OUT_SL_LB for Y-connection output synthesizing. Two outputs of the two units of the output-side amplifiers 2nd_Stg_HB of the second RF power amplifier HPA2, coupled in parallel, are similarly fed to two input of the stripline OUT_SL_HB for Y-connection output synthesizing, respectively. A second RF transmission output signal Pout_HB for any of DCS1800, PCS1900, and WCDMA1900 is sent out from an output of the stripline OUT_SL_HB for Y-connection output synthesizing. Further, a power detection signal VDET of the power detector DET is sent out from the right-hand side of the RF power module RF_PAM1. A first RF transmission input signal Pin_LB for either GSM850 or GSM900, a second RF transmission input signal Pin_HB for any of DCS1800, PCS1900, and WCDMA1900, and a mode signal MODE are fed to the RF power module RF_PAM1 from the left-hand side thereof. Furthermore, both the two units of the output-side amplifiers 2nd_Stg_LB, and the two units of the output-side amplifiers 2nd_Stg_HB are each comprised of an amplifier called DD_CIMA type. DD_CIMA stands for Divided-Device and Collectively Impedance-Matched Amplifier.

Further, with the RF power module RF_PAM1 shown in FIG. 14, as well, the transmission line transformers TLT11, TLT12, TLT21, and TLT22 each can be configured in the same way as in the case of any of the embodiments of the invention, shown in FIGS. 4, 8, 9, 10, 11, and 12, respectively. That is, a joint between the one end In (A) of the main line Lout of the transmission line transformer leading from a drain output electrode of the RF-LDMOS, and the other end Lin (A) of the secondary line Lin is formed at the energy transmission coupling part between the main line Lout and the secondary line. By so doing, an occupied area of the RF power amplifier, over the main surface of a circuit board, can be reduced, and the condition for impedance matching at each of the transmission line transformers TLT12, TLT22, as an impedance matching circuit, against the antenna, can be maintained.

In particular, as shown in a lower part of FIG. 14, drain output signals from two RF-LDMOS transistors Q1, Q2 of the two units of the output-side amplifiers 2nd_Stg_LB, respectively, are fed to the two inputs of the stripline OUT_SL_LB for Y-connection output synthesizing via bonding wires BW. Further, an output of the stripline OUT_SL_LB for Y-connection output synthesizing, as well, is coupled to a bonding pad joint CP of the transmission line transformer TLT12 serving as an output matching circuit for the first RF transmission output signal Pout_LB via the bonding wires BW. The bonding pad joint CP is formed at a transmission coupling part located between the main line Lout of the transmission line transformer TLT12, and the secondary line Lin thereof. In FIG. 14, as well, the main line Lout of the transmission line transformer TLT12, as an upper-level interconnection of multilevel interconnections, is formed above the secondary line Lin of the transmission line transformer TLT12, as a lower-level interconnection of the multilevel interconnections. That is, part of the main line Lout, above the energy transmission coupling part, is formed so as to serve as the bonding pad joint CP for four bonding wires BW coupled to the output of the stripline OUT_SL_LB for Y-connection output synthesizing. Furthermore, the part of the main line Lout of the transmission line transformer TLT, as the bonding pad joint CP, is one end In (A) of the main line Lout of the transmission line transformer TLT, the respective drain output signals from the two units of RF-LDMOS transistors Q1, Q2 of the two units of the output-side amplifiers 2nd_Stg_LB, in the final amplification stage of the RF power amplifier, being fed thereto. Further, transmission power to be fed to a 50-Ω antenna (not shown) of a cellular telephone is outputted from an output terminal Pout_LB of the RF power module.

Still further, in FIG. 14, as well, by applying an operating voltage Vdd differing in level from the ground voltage level to the AC grounding node at one end {Lin (B)} of the secondary line Lin, the operating voltage Vdd is fed to respective drain output electrodes of the two units of RF-LDMOS transistors Q1, Q2 via the secondary line Lin, and the stripline OUT_SL_LB for Y-connection output synthesizing.

While the invention developed by the inventor, et al. has been specifically described as above with reference to preferred embodiments thereof, it goes without saying that various changes and modifications may be made in the invention without departing from the spirit and scope thereof.

For the power transistor of the RF power amplifier, use can be made of, for example, a FET using a compound semiconductor of GaAs, and so forth, such as a HEMT, besides the hetrojunction bipolar transistor formed of GaAs, and InP, or the hetrojunction bipolar transistor formed of SiGe, and the LDMOS.

Further, the main line Lout of the transmission line transformer, and the secondary line Lin thereof may be formed in the shape of a polygon such as a pentagon, hexagon, and so forth, or a circle such as a spiral and so forth, besides a quadrilateral shape having quadrilateral or circular corner portions.

Still further, the invention has been described with reference to the cellular telephone terminal, in the foregoing, however, application of the invention is not limited to the cellular telephone terminal, and the invention can be widely applied to a cellular telephone base station, wireless LAN, on-board equipment, household appliances, and other equipment and apparatuses, using wireless communications.

What is claimed is:

1. An RF amplifying device comprising:
    a power transistor for generating transmission power to be fed to an antenna of a wireless device; and
    a transmission line transformer which uses an inductive capacitive coupling and which is thereby coupled to an output electrode of the power transistor,
    wherein the transmission line transformer includes a main line, and a secondary line, wherein the transmission power from the output electrode of the power transistor is fed to one end of the main line while one end of the secondary line is coupled to an AC grounding node, wherein the other end of the secondary line is coupled to the one end of the main line, thereby generating the transmission power to be fed to the antenna from the other end of the main line, wherein coupling energy is transmitted from the secondary line to the main line at an energy coupling part where the main line of the transmission line transformer is in close proximity of, and opposite to the secondary line, and wherein coupling members electrically coupled to the output electrode of the power transistor are electrically coupled to a joint formed in either the main line, or the secondary line, at part of the energy coupling part.

2. The RF amplifying device according to claim 1,
wherein an operating voltage differing in level from a ground voltage level is applied to the AC grounding node at the one end of the secondary line, thereby causing the operating voltage to be fed to the output electrode of the power transistor via the secondary line.

3. The RF amplifying device according to claim 1,
wherein both the main line and the secondary line of the transmission line transformer are comprised of multilevel interconnections formed over an insulated board.

4. The RF amplifying device according to claim 3,
wherein the power transistor is formed over a semiconductor chip,
wherein the coupling members electrically coupled to the output electrode of the power transistor formed over the semiconductor chip are either bonding wires, or bonding balls, and
wherein the joint electrically coupled to the coupling members and formed in the part of the energy coupling part is a bonding pad joint formed over the insulated board.

5. The RF amplifying device according to claim 1,
wherein the power transistor, and both the main line and the secondary line of the transmission line transformer are formed over a semiconductor substrate of a monolithic microwave integrated circuit.

6. The RF amplifying device according to claim 1,
wherein the power transistor is either a hetrojunction bipolar transistor, or an LDMOS.

7. An RF amplifying device comprising:
a power transistor for generating transmission power to be fed to an antenna of a wireless device; and
a transmission line transformer coupled to an output electrode of the power transistor,
wherein the transmission line transformer includes a main line, and a secondary line,
wherein the transmission power from the output electrode of the power transistor is fed to one end of the main line while one end of the secondary line is coupled to an AC grounding node,
wherein the other end of the secondary line is coupled to the one end of the main line, thereby generating the transmission power to be fed to the antenna from the other end of the main line,
wherein coupling energy is transmitted from the secondary line to the main line at an energy coupling part where the main line of the transmission line transformer is in close proximity of, and opposite to the secondary line,
wherein coupling members electrically coupled to the output electrode of the power transistor are electrically coupled to a joint formed in either the main line, or the secondary line, at part of the energy coupling part, and wherein both the main line and the secondary line of the transmission line transformer are formed of a common interconnection layer in the shape of a spiral in a single layer.

8. An RF amplifying device comprising:
a first power amplifier for amplifying a first RF transmission input signal having a first frequency band; and
a second power amplifier for amplifying a second RF transmission input signal having a second frequency band higher in frequency than the first frequency band,
wherein the first power amplifier includes a first power transistor for generating a first transmission input power to be fed to an antenna of a wireless device by amplifying the first RF transmission input signal, and a first transmission line transformer coupled to a first output electrode of the first power transistor,
wherein a second power amplifier includes a second power transistor for generating a second transmission power to be fed to the antenna of the wireless device by amplifying the second RF transmission input signal, and a second transmission line transformer coupled to a second output electrode of the second power transistor,
wherein the first transmission line transformer, and the second transmission line transformer each include a main line and a secondary line, respectively,
wherein the transmission power from the output electrode of the power transistor is fed to one end of the main line while one end of the secondary line is coupled to an AC grounding node,
wherein the other end of the secondary line is coupled to the one end of the main line, thereby generating the transmission power to be fed to the antenna from the other end of the main line,
wherein coupling energy is transmitted from the secondary line to the main line at an energy coupling part of each of the transmission line transformers, where the main line of the transmission line transformer is in close proximity of, and opposite to the secondary line thereof, and
wherein coupling members electrically coupled to the output electrode of the power transistor are electrically coupled to a joint formed in either the main line, or the secondary line, at part of the energy coupling part.

9. The RF amplifying device according to claim 8,
wherein an operating voltage differing in level from a ground voltage level is applied to the AC grounding node at the one end of the secondary line of each of the transmission line transformers, thereby causing the operating voltage to be fed to the output electrode of the power transistor via the secondary line.

10. The RF amplifying device according to claim 8,
wherein both the main line and the secondary line of each of the transmission line transformers are comprised of multilevel interconnections formed over an insulated board.

11. The RF amplifying device according to claim 8,
wherein each of the power transistors, and both the main line and the secondary line of each of the transmission line transformers are formed over a semiconductor substrate of a monolithic microwave integrated circuit.

12. The RF amplifying device according to claim 9,
wherein the power transistors each are formed over a semiconductor chip,
wherein the coupling members electrically coupled to the output electrode of each of the power transistors formed over the semiconductor chip are either bonding wires, or bonding balls, and wherein the joint formed in the part of the energy coupling part electrically coupled to the coupling members is a bonding pad joint formed over insulated board.

13. The RF amplifying device according to claim 8, wherein the first RF transmission input signal is either GSM850 or GSM900, and the second RF transmission input signal is any of DCS1800, PCS1900, and WCDMA1900.

14. The RF amplifying device according to claim 8, wherein the power transistors each are either a hetrojunction bipolar transistor, or an LDMOS.

15. An RF amplifying device comprising:
first and second power transistors for generating transmission power to be fed to an antenna of a wireless device;
a stripline for output synthesizing, having first and second inputs coupled to first and second output electrodes of the first and second power transistors, respectively; and
a transmission line transformer coupled to an output of the stripline for output synthesizing,
wherein the transmission line transformer includes a main line, and a secondary line,
wherein the transmission power from the output of the stripline for output synthesizing is fed to one end of the main line while one end of the secondary line is coupled to an AC grounding node,
wherein the other end of the secondary line is coupled to the one end of the main line, thereby generating the transmission power to be fed to the antenna from the other end of the main line,
wherein coupling energy is transmitted from the secondary line to the main line at an energy coupling part where the main line of the transmission line transformer is in close proximity of, and opposite to the secondary line, and
wherein coupling members electrically coupled to the output of the stripline for output synthesizing are electrically coupled to a joint formed in either the main line, or the secondary line, at part of the energy coupling part.

16. The RF amplifying device according to claim 15, wherein an operating voltage differing in level from a ground voltage level is applied to the AC grounding node at the one end of the secondary line, thereby causing the operating voltage to be fed to the first and second output electrodes of the first and second power transistors, respectively, via the secondary line, and the stripline for output synthesizing.

17. The RF amplifying device according to claim 15, wherein both the main line and the secondary line of the transmission line transformer are comprised of multi-level interconnections formed over an insulated board.

18. The RF amplifying device according to claim 15, wherein the respective power transistors, and both the main line and the secondary line of each of the transmission line transformers are formed over a semiconductor substrate of a monolithic microwave integrated circuit.

19. The RF amplifying device according to claim 17, wherein the first and second power transistors are formed over a semiconductor chip,
wherein the first and second output electrodes of the first and second power transistors, formed over the semiconductor chip, are coupled to the first and second inputs of the stripline for output synthesizing, respectively, via, first bonding wires and second bonding wires, respectively, and
wherein the output of the stripline for output synthesizing is coupled to the one end of the main line via a fourth bonding wire.

20. The RF amplifying device according to claim 15, wherein the first and second power transistors each are either a hetrojunction bipolar transistor, or an LDMOS.

* * * * *